US008723605B2

(12) United States Patent
Jones et al.

(10) Patent No.: US 8,723,605 B2
(45) Date of Patent: *May 13, 2014

(54) EFFICIENT POWER AMPLIFIER

(75) Inventors: Owen Jones, San Rafael, CA (US);
Lawrence R. Fincham, San Rafael, CA (US)

(73) Assignee: THX Ltd, San Francisco, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/365,861

(22) Filed: Feb. 3, 2012

(65) Prior Publication Data

US 2013/0033328 A1 Feb. 7, 2013

Related U.S. Application Data

(63) Continuation of application No. 12/910,565, filed on Oct. 22, 2010, now Pat. No. 8,138,837, which is a continuation of application No. 12/253,047, filed on Oct. 16, 2008, now Pat. No. 7,834,702.

(60) Provisional application No. 60/980,344, filed on Oct. 16, 2007.

(51) Int. Cl.
*H03F 3/04* (2006.01)
*H03F 1/02* (2006.01)

(52) U.S. Cl.
CPC .................................. *H03F 1/02* (2013.01)
USPC ........................................ 330/297; 330/127

(58) Field of Classification Search
USPC ............................. 330/127, 136, 297
See application file for complete search history.

(56) References Cited

U.S. PATENT DOCUMENTS

| 4,218,660 A | 8/1980 | Carver | 330/297 |
| 4,337,441 A | 6/1982 | Kellogg | 330/261 |
| 4,445,095 A | 4/1984 | Carver | 330/297 |

(Continued)

FOREIGN PATENT DOCUMENTS

| DE | 44 10 498 | 10/1994 |
| DE | 44 00 435 | 7/1995 |

(Continued)

OTHER PUBLICATIONS

Walker, P.J., et al., "Current Dumping Audio Amplifier," Acoustical Mfg. Co. Ltd., Huntingdon, England, L-46, Wireless World, Feb., 1971, 5 pages.

(Continued)

*Primary Examiner* — Robert Pascal
*Assistant Examiner* — Khiem Nguyen
(74) *Attorney, Agent, or Firm* — Irell & Manella LLP

(57) ABSTRACT

A dynamic power supply for N amplifiers includes first and second power boost circuits which temporarily boost the positive or negative power supply rail, respectively. A control circuit monitors amplifier output signal levels and provides power boost control signals to the power boost circuits, which temporarily raise the positive supply voltage above the nominal voltage level in tandem with the highest output signal from the N amplifiers and lower the negative supply voltage below the nominal voltage level in tandem with the lowest output signal level from the N amplifiers. The power boost circuits each may be coupled to a reservoir capacitor from which current is drawn to provide the power boost. When inactive, the reservoir capacitors charge up from the respective power supply rails. The dynamic power supply is well suited for audio amplification systems.

34 Claims, 17 Drawing Sheets

(56) References Cited

U.S. PATENT DOCUMENTS

| | | | | |
|---|---|---|---|---|
| 4,507,619 | A * | 3/1985 | Dijkstra et al. | 330/297 |
| 4,586,002 | A | 4/1986 | Carver | 330/297 |
| 4,620,317 | A | 10/1986 | Anderson | 381/90 |
| 4,752,747 | A | 6/1988 | Botti et al. | |
| 5,157,353 | A | 10/1992 | Lendaro | 330/297 |
| 5,748,753 | A | 5/1998 | Carver | 381/96 |
| 6,104,238 | A | 8/2000 | Mattisson et al. | 329/319 |
| 6,104,248 | A | 8/2000 | Carver | |
| 6,166,605 | A | 12/2000 | Carver | 330/297 |
| 6,373,335 | B1 | 4/2002 | Carver | 330/10 |
| 6,373,340 | B1 | 4/2002 | Shashoua | 330/297 |
| 6,459,799 | B1 | 10/2002 | Smits | |
| 6,498,521 | B1 | 12/2002 | Bicakci et al. | |
| 6,636,103 | B2 | 10/2003 | Wercer et al. | |
| 2002/0089313 | A1 | 7/2002 | Shashoua | 323/209 |
| 2002/0094795 | A1 | 7/2002 | Mitzlaff | 455/245.1 |
| 2002/0153940 | A1 | 10/2002 | Wurcer et al. | 327/536 |
| 2003/0123678 | A1 | 7/2003 | Kemmerer et al. | |
| 2005/0129258 | A1 | 6/2005 | Fincham | |
| 2005/0259831 | A1 | 11/2005 | Hutt et al. | |
| 2006/0126860 | A1 | 6/2006 | Sievers et al. | |
| 2006/0126862 | A1 | 6/2006 | Andrews et al. | |
| 2007/0140513 | A1 | 6/2007 | Furge | |
| 2013/0034251 | A1 | 2/2013 | Fincham | |

FOREIGN PATENT DOCUMENTS

| | | | |
|---|---|---|---|
| EP | 0 969 593 | 1/2000 | |
| JP | 56 007504 | 1/1981 | |
| JP | 57 154913 | 9/1982 | |
| JP | 6-291561 | 10/1994 | |
| NL | 8 601 639 | 1/1988 | |
| WO | WO 01/043276 | 12/1999 | H03F 1/02 |

OTHER PUBLICATIONS

Vanderkooy, John, et al., "Feedforward Error Correction in Power Amplifiers," Journal of the Audio Engineering Society, Jan./Feb. 1980, vol. 28, No. 1/2, pp. 2-16.

STA550, 50+50W Stereo Bash Power Amplifier, Product Review, STMicroelectronics, Jul. 2001.

STA5150, 150W Mono Bash Power Amplifier, Product Review, STMicroelectronics, Jul. 2001.

STA5100, 100W Mono Bash Power Amplifier, Product Review, STMicroelectronics, Aug. 2001.

"Understanding BCA class-I," Crown Audio Inc., 2002.

Assembling Instructions, FT326, 70W Class H Booster, Futurel, undated.

"TDA156Q; 70 W high efficiency power amplifier with diagnostic facility" Koninklijke Philips N. V., 2002.

Assembling Instructions, FT326, 70W Class H Booster, Futurel, Apr. 22, 2001.

Extended European Search Report, dated Oct. 28, 2011, EPO Patent Appln. No. 08166844.4.

Partial European Search Report, dated Jun. 21, 2011, EPO Patent Appln. No. 08166844.4.

Extended European Search Report dated Jan. 7, 2013, EPO Patent Appln. No. 11170598.4.

* cited by examiner

EFFICIENT POWER AMPLIFIER

RELATED APPLICATION INFORMATION

This application is a continuation of U.S. patent application Ser. No. 12/910,565, filed Oct. 22, 2010, which is a continuation of U.S. patent application Ser. No. 12/253,047, filed Oct. 16, 2008, now U.S. Pat. No. 7,834,702, which claims the benefit of U.S. Provisional Application Ser. No. 60/980,344, filed on Oct. 16, 2007, all of which are hereby incorporated by reference as if set forth fully herein.

BACKGROUND OF THE INVENTION

1. Field of the Invention

The field of the present invention relates to power amplification and, more specifically, to apparatus and methods for amplifying electronic signals such as audio signals.

2. Background

With a conventional power amplifier, the maximum available output power is generally limited by at least two factors: the voltage swing available at the amplifier's output, and the load impedance. The voltage swing is itself typically limited by the amplifier rail voltage. In the case of a car audio amplifier for instance, the rail voltage is the nominal 14.4 Volts of the car battery; thus, if the amplifier were able to swing all the way up to the power rails, it could deliver ~7 Volts peak output. This peak voltage is only sufficient to deliver about 3 Watts of power to an 8Ω load. To obtain greater output power, the load impedance can be reduced (for example, a 1Ω load would allow 25 Watts of output power), but in order not to encounter significant losses in the wiring, the cables need to be thicker and heavier.

In general, lowering the load impedance on an amplifier will increase the current that has to be supplied by the amplifier and increase the amplifier distortion as well as requiring more expensive output devices. Thus, merely lowering the load impedance by itself may not provide additional power. It would therefore be advantageous to be able to increase the voltage output available from the amplifier so that, for example, a higher load impedance can be employed and/or greater power be delivered to a load.

One technique for increasing output voltage is known as bridging, whereby two anti-phase amplifiers are used with the load tied between their outputs. This approach can double the available output swing and for a given load impedance, which would quadruple the output power. Even so, the maximum available power to a 1Ω load, using the typical power supply conditions described above, would be limited to approximately 100 Watts, and would still have the complication of a low impedance load. However, this simplified analysis hides the fact that under these conditions, each amplifier is not only having to supply twice the output current as compared to the non-bridged condition, but also sees half the effective load impedance. In practical applications, the amplifiers may not be able to supply the required current.

A more valid comparison might be to calculate the maximum output that can be achieved for a given maximum output current capability. In the case of the bridge amplifier, the load impedance would therefore be double that used for the single amplifier example. With twice the load resistance, the power into the load is only twice that of the single amplifier. The effective load impedance seen by each half of the bridge amplifier is now the same as the single amplifier example and given that the load current sourced by the amplifier is the same, then the amplifier distortion is the same also.

For applications in which the amplifier is driving a speaker load for audio sound reproduction, the bridge amplifier could be replaced by two single amplifiers, each driving one of a pair of voice coils on a dual voice coil loudspeaker. The overall output level from the loudspeaker would then be identical for the bridge amplifier and the two single amplifiers.

Another technique to increase effective power output is to employ a switching power supply to raise the power supply voltage to the amplifier. The amplifier output voltage capability is thereby increased, allowing a higher load impedance to be used for a given output current capability. This approach can mitigate the need for a low load impedance. However, a switching power supply typically operates at high frequency and high power and needs careful design to avoid interference.

Another technique, which has been employed, for example, by Philips Semiconductors of Eindhoven, the Netherlands, in its TDA1560/1562 products, involves an amplifier system that modulates its own supply voltage in order to provide a higher output voltage swing. A bridge amplifier is used in conjunction with a capacitive booster circuit that lifts the supply to approximately twice the steady-state level when a larger output voltage swing is required. Under quiescent conditions, the output of each amplifier in the bridge sits at approximately half the battery voltage. As the output of one half of the bridge amplifier approaches the positive supply rail, the booster circuit begins to lift the supply voltage so that the amplifier does not clip. However, at the same time, the output of the other half of the bridge amplifier approaches ground. The output can go no lower than ground potential, and so the amplifier system adds the difference between the actual negative going output and the desired negative going output to the positive going output at the other side of the bridge amp. This operation can result in significantly distorted waveforms at each individual output of the bridge amplifier, but the output measured differentially across the two outputs is generally linear (within the limitations of the correction circuitry). The booster circuit adjusts to maintain sufficient headroom above this modified output waveform. Thus the bridge amplifier output is able to increase sufficiently to give a peak output voltage close to twice the battery voltage, at the expense that this technique can generally only be used in bridge amplifier mode.

While the foregoing approaches may increase the effective output capability of an amplifier, they still have appreciable limitations. It would therefore be advantageous to provide an improved audio amplification apparatus or method which overcomes one or more of the foregoing problems or limitations, provides increased power output when needed, and/or provides other benefits and advantages. It would further be advantageous to provide an efficient audio amplification apparatus or method which provides increased power output without the need for a bridge amplifier or a switching power supply.

SUMMARY OF THE INVENTION

Certain embodiments disclosed herein are generally directed, in one aspect, to a power boost circuit for an amplification system. The power boost circuit receives, as an input, an output signal from an amplifier receiving a power supply input voltage signal from a power supply rail. The power boost circuit tracks the output signal from the amplifier and temporarily boosts the power supply input voltage signal feeding the amplifier, by drawing current from a reservoir capacitor when the output signal from the amplifier approaches the power supply rail voltage within a predetermined threshold. The power boost circuit may continuously maintain the power supply input voltage signal above the power supply rail voltage by the amount of the predetermined threshold.

In another aspect, an amplification system has independent positive and negative power supply rail boost capability through a first power boost circuit and a second power boost circuit which each receive, as an input, an output signal from an amplifier to be supplied. The first power boost circuit and said second power boost circuit are selectively engaged to temporarily boost positive and negative power supply input voltage levels to the amplifier as the output signal from said amplifier approaches or exceeds a positive power supply rail or a negative power supply rail, respectively.

In yet another aspect, a dynamic amplification system for providing power to a plurality of amplifiers includes a first power boost amplifier electrically connected to a first power supply rail and a second power boost amplifier electrically connected to a second power supply rail. A power boost control circuit monitors output signal levels from the plurality of amplifiers and provides power boost control signals to the power boost amplifiers. As a result, the first power boost amplifier temporarily boosts the first power supply rail above a first nominal voltage level in tandem with the highest output signal level from the amplifiers, and the second power boost amplifier temporarily lowers the second power supply rail below a second nominal voltage level in tandem with the lowest output signal level from said amplifiers. In certain embodiments, the first power boost amplifier may draw current from a first reservoir capacitor when active to boost the first power supply rail above the first nominal voltage level, and, similarly, the second power boost amplifier may draw current from a second reservoir capacitor when active to lower the second power supply rail below the second nominal voltage level.

Further embodiments, variations and enhancements are also disclosed herein.

BRIEF DESCRIPTION OF THE DRAWINGS

FIGS. 13A, 13B-1 and 13B-2 are detailed circuit schematics of an embodiment of a power amplifier including power rail boost circuitry.

DETAILED DESCRIPTION OF PREFERRED EMBODIMENTS

Certain embodiments disclosed herein are generally directed, in one or more aspects, to a power boost system or circuit which tracks an amplifier input or output signal and temporarily boosts the power supply voltage signal feeding the amplifier when required by the needs of the amplifier output signal. Some of these embodiments are designed in certain respects to overcome the limitations in the prior art and thereby enable a larger peak-to-peak voltage swing of, e.g., up to three times the supply or battery voltage, without necessarily the use of a bridged amplifier configuration or the need for a high frequency switching power supply. Some of these embodiments may also provide for greater efficiency than a standard amplifier configuration, especially with audio signal amplification, thereby reducing heat-sinking requirements. The high output voltage swing also may permit a relatively normal load impedance to be used.

Embodiments as disclosed herein may be employed in a variety of applications, and may be particularly well suited for situations in which it is desired to attain a temporary boost in output power. In particular, various embodiments as described herein may be well suited for audio amplification systems which may operate mostly within the bounds of the nominal voltage rails but occasionally require peak voltage swings that exceed the nominal voltage rails.

Figure 1:
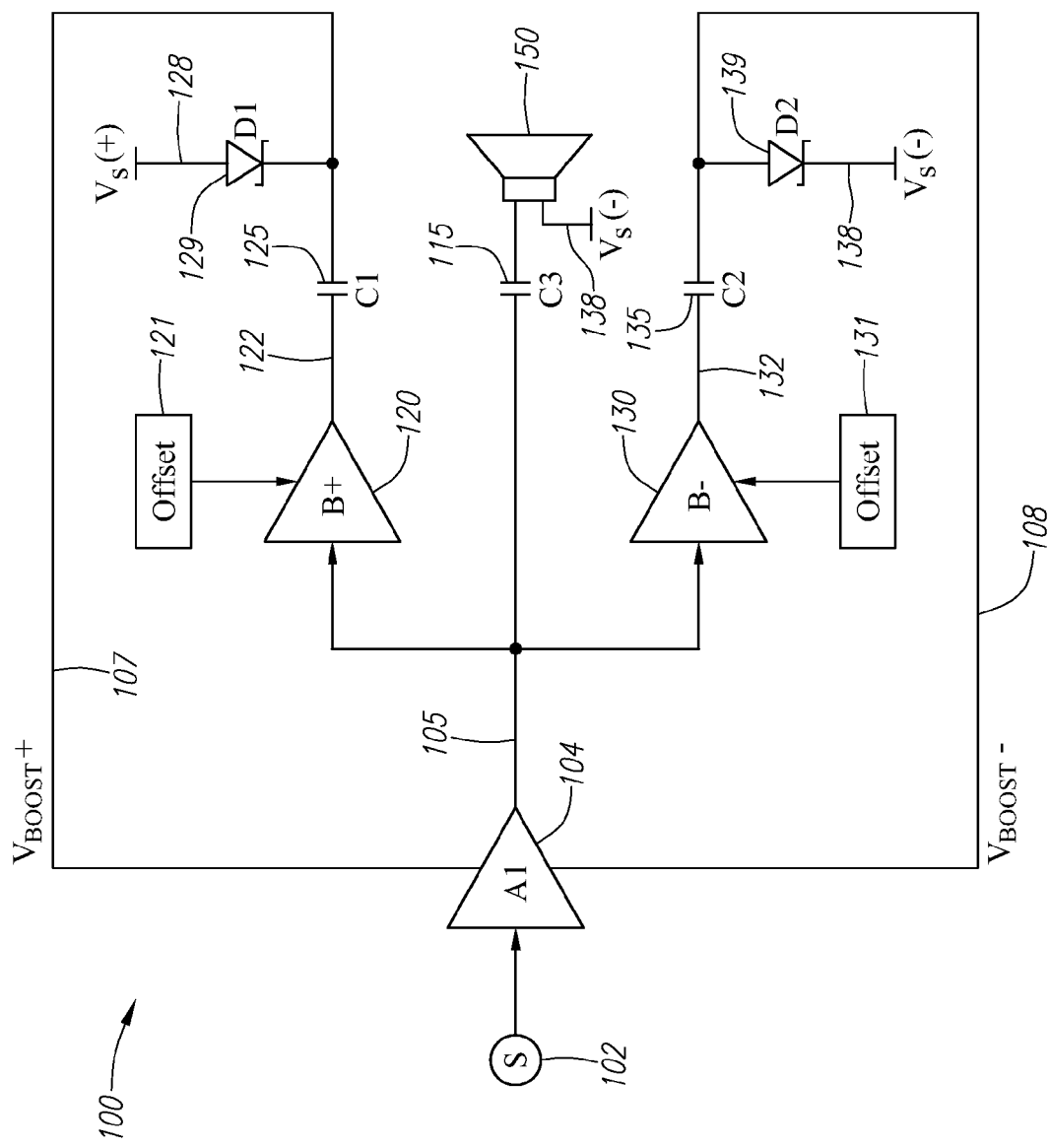
FIG. 1 is diagram of a single-channel power amplifier including power rail boost circuitry in accordance with one or more embodiments as disclosed herein.

FIG. 1 is a high-level diagram of a single-channel power amplification system 100 in accordance with one or more embodiments as disclosed herein. Although FIG. 1 illustrates only a single-channel power amplifier, its principles are applicable to multi-channel amplifiers as well, some of which are described later herein in greater detail. In FIG. 1, a main amplifier 104 (denoted "A1") amplifies a source signal 102. The main amplifier 104 may be of any conventional design, although it preferably has a high power supply rejection ratio (PSRR). The main amplifier 104 in this example is connected to a loudspeaker 150, optionally through a coupling capacitor 115 ("C3"), in a conventional manner. The main amplifier 104 is coupled to the power supply lines 128 (Vs+) and 138 (Vs−) through diodes 129 ("D1") and 139 ("D2"), respectively. Diodes 129 and 139 are preferably Schottky type diodes, or have similar characteristics thereto, so as to provide rapid switching time and also to maximize the potential boost level.

Positive power boost amplifier 120 (denoted "B+" in part because it pertains to the positive supply voltage) and negative power boost amplifier 130 (denoted "B−" in part because it pertains to the negative supply rail) are coupled to power supply lines 128 (Vs+) and 138 (Vs−), respectively. The positive and negative power boost amplifiers 120 and 130 are coupled to the power supply inputs 107, 108 (denoted Vboost+ and Vboost− in FIG. 1) of the main amplifier 104 via reservoir capacitors 125 ("C1") and 135 ("C2"). Offset signal inputs 121, 131 are coupled to power boost amplifiers 120 and 130, respectively. Offset signal 121 is provided so that the output signal 122 from positive power boost amplifier 120 is at Vs− (the negative supply rail) when its boost function is inactive, and offset signal 131 is provided so that the output signal 132 is at voltage level Vs+ (the positive supply rail) when its boost function is inactive. As a result, the first reservoir capacitor 125 is normally fully charged when the positive boost function is not required, and has a voltage across it of (Vs+−Vs−−VD1), where VD1 is the voltage drop across D1. Likewise, the second reservoir capacitor 135 is normally fully charged when the negative boost function is not required, and has a voltage across it of (Vs+−Vs−−VD2), where VD2 is the voltage drop across D2. With a 14.4V power supply, the voltage across each of the reservoir capacitors 125, 135 would thus typically be about 13.9 Volts.

In operation, power boost amplifiers 120 and 130 sense the output of the main amplifier 104, and produce output signals 122, 132 that drive the power supply inputs 107, 108 of the main amplifier 104 via reservoir capacitors 125 ("C1") and 135 ("C2"). Under quiescent conditions, the DC output voltage of the main amplifier 104 to be supplied is generally lies halfway between the positive and negative power supply rails Vs+ and Vs−. When the required output of the main amplifier 104 is less than the limits imposed by power supply rails Vs+ and Vs−, the amplification system 100 operates as a conventional amplifier. In other words, the main amplifier 104 draws power from the positive and negative supply lines 128, 138 via D1, D2 respectively, and the source signal 102 is amplified by main amplifier 104 in a conventional manner.

However, when the source signal 102 reaches amplitudes requiring that the output signal 105 approach or exceed the power supply rails 128 (Vs+) and/or 138 (Vs−), the operation of the amplification system 100 changes to allow increased power output. The main amplifier 104 normally derives current from the power supply rails Vs+ and Vs− via diodes D1 and D2 (129 and 139), and delivers power to the load, i.e., the loudspeaker 150. Thus, the maximum peak-to-peak output voltage under ordinary conditions, without the effect of positive or negative power boost amplifiers 120, 130, is generally given by the equation: (Vs+−Vs−)−(VD1+VD2); that is, the maximum peak-to-peak output voltage is the difference between the positive and negative supply rails less the voltage drops caused by diodes 129, 139. In the amplification system 100, as the output voltage from the main amplifier 104 approaches the positive or negative supply rail, power boost amplifier 120 or 130 (depending upon the polarity of the signal) will force a temporary increase to power supply input (s) 107 and/or 108 as needed, allowing the main amplifier 104 to increase the amplitude of its output signal 105 and its overall power output.

The power boost operation of amplification system 100 will now be explained in greater detail, taking first the example where the source signal 102 is positive and will require a boost in the positive power supply input 107. As the output signal 105 from the main amplifier 104 approaches the positive supply rail Vs+ within a certain, range (typically 1.5 Volts) of Vs+, the output 122 of power boost amplifier 120 (B+) starts to rise up from its quiescent state, which is at Vs− potential. In its quiescent state, power boost amplifier 120 charges up reservoir capacitor 125 (C1) to a voltage of (Vs+−VD1), where VD1 is the drop in voltage across diode 129 (D1). The rise in output signal 122 caused by the rise in main amplifier output signal 105 is transferred via the reservoir capacitor 125 (C1) to the positive power supply input 107 of the main amplifier 104, raising its potential (Vboost+). As this occurs, diode 129 (D1) is cut off so that the positive power supply input 107 of main amplifier 104 becomes isolated from the positive power supply rail Vs+ and, instead, its input current is derived from the output of power boost amplifier 120 (B+) via reservoir capacitor 125 (C1). As a result, the main amplifier output signal 105 is no longer limited by the positive power supply rail Vs+.

If power boost amplifier 120 (B+) has, for example, unity gain, then the voltage level of positive power supply input 107 to main amplifier 104 tracks the main amplifier 104's output voltage, albeit with an offset of some amount, so that the difference between the voltage level of the main amplifier output 105 and its supply voltage, Vboost+, is held relatively constant at, e.g., approximately 1.5 Volts. Thus the output 105 of the main amplifier 104 is permitted rise above the positive power supply voltage Vs+ while preventing saturation and/or clipping.

This manner of operation may continue until the output 122 of power boost amplifier 120 reaches the positive rail voltage Vs+ and clips. The main amplifier's positive power supply input 107 (Vboost+) then rises no further, and the output 105 of the main amplifier 104 can then only rise slightly higher until it too clips at a final potential of (2Vs+−VD1).

When the output signal 105 from main amplifier 104 swings the other direction, i.e., negative, then a similar effect occurs with negative power boost amplifier 130 (B−), reservoir capacitor 135 (C2), and diode 139 (D2). These components act in a similar manner to the positive supply components, but instead move the negative power supply input 108 (Vboost−) below the potential of the negative supply rail Vs−. This manner of operation may continue until the output 132 of negative power boost amplifier 130 reaches the negative rail voltage Vs− and clips. The main amplifier's negative power supply input 108 (Vboost−) then drops no further, and the output 105 of the main amplifier 104 can then only drop slightly lower until it too clips at a final potential of (2Vs−+VD2).

It may be thus seen that both the positive and negative power supply inputs 107 and 108 of main amplifier 104 can be independently boosted, with the positive power supply input 107 being boosted above the positive supply rail Vs+ and the negative power supply input 108 being boosted below the negative supply rail Vs−. This effect provides a large voltage swing capability to the main amplifier 104. An amplification system 100 configured in accordance with FIG. 1 can be built without a bridged amplifier arrangement and without a switching power supply, yet still have a large voltage swing capability.

The increased voltage swing, on the order of 41 Volts peak-to-peak from a 14.4 Volt power supply, means that approximately 27 Watts can be delivered into an 8Ω load, as compared to the typical 3.7 Watts for a conventional amplifier, or roughly 15 Watts for a bridged amplifier. For purposes of comparison, taking maximum current capability as the limiting factor, (roughly 2.6 Amps for the amplification system 100 in a typical setting), only 10 Watts would be available into 3 Ohms for a conventional amplifier, and 20 Watts into 6 Ohms from a bridged amplifier, but at increased distortion due to the lowered load impedance presented to the amplifiers.

In a practical system, there may be limitations on the ability of the power boost amplifiers 120, 130 to swing fully to their rail voltages. However, with careful design, particularly according to techniques described later herein, such limitations may be minimized.

Another advantage that may be provided by the amplification system 100 of FIG. 1 is reduced power dissipation. The main amplifier 104 generally dissipates much less power than a conventional amplifier of the same output power capability, as there less voltage loss across its power transistors. Thus, the power transistors of the main amplifier 104 can have lower voltage and/or power ratings than a conventional amplifier, although they should still be capable of passing the full output current. The power transistors used for power boost amplifiers 120, 130 may also have low voltage/power ratings as they are generally not subject to a greater voltage than the difference between the supply rails (that is, Vs+−Vs−). Although the peak power dissipation in the various amplifiers of amplification system 100 may at times be relatively high, the overall power dissipation may remain low particularly in settings where the input source signal 102 only occasionally requires high output power. For example, in audio reproduction systems, the boost mode provided by power boost amplifiers 120, 130 would, in a typical situation, rarely be utilized because the average signal level in audio reproduction is considerably less than the peak level. For most of the time, power boost amplifiers 120, 130 dissipate essentially no power, and so their average power dissipation is low. In addition to being power efficient, they also have the advantage of needing a smaller heatsink, since their average power dissipation is low.

The principles of the amplification system 100 illustrated in FIG. 1 may be extended to systems having more than one channel and/or more than one main amplifier. In multi-channel or multi-amplifier systems, it would be possible to provide power boost amplifiers such as 120 and 130 for each channel and/or main amplifier. Alternatively, it is possible to have power boost amplifiers such as 120 and 130 shared among multiple channels and/or amplifiers. An example of one embodiment of this type is illustrated, in somewhat simplified form, in FIG. 2.

Figure 2:
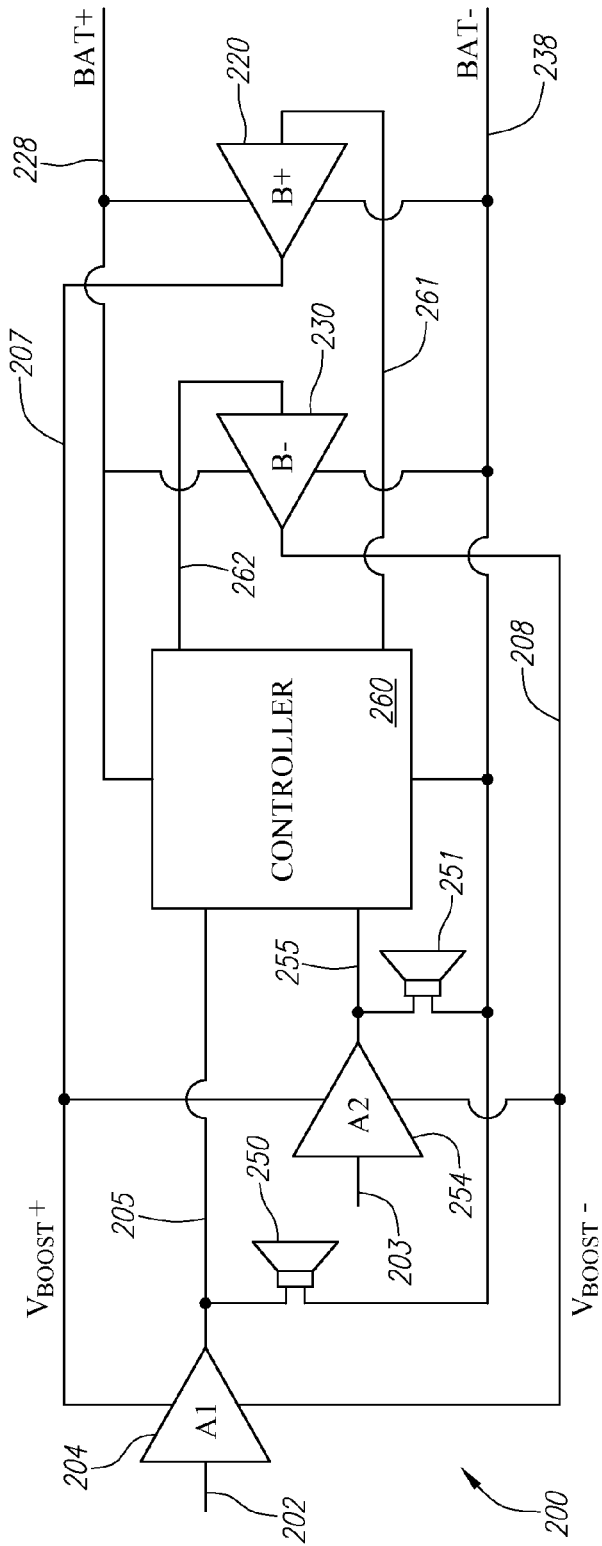
FIG. 2 is a diagram of a dual-channel power amplifier including power rail boost circuitry in accordance with various embodiments as disclosed herein.

As shown in FIG. 2, a multi-channel amplification system 200 includes, in this example, two main amplifiers 204, 254 (also denoted "A1" and "A2") to be supplied, and, as in FIG. 1, two power boost amplifiers 220, 230. The output of the first power boost amplifier 220 is coupled to the positive power supply inputs of both main amplifiers 204, 254, while the output of the second power boost amplifier 230 is coupled to the negative power supply inputs of both main amplifiers 204, 254. In other words, the main amplifiers 204, 254 have common power supply inputs. The first main amplifier 204 amplifies a first input source signal 202, and produces an output signal 205 which is provided to a loudspeaker 250 as well as a controller 260. Similarly, the second main amplifier 254 amplifies a second input source signal 203, and produces an output signal 255 which is provided to another loudspeaker 251 as well as the controller 260.

In operation, the amplification system 200 works in a very similar way to the amplification system 100 of FIG. 1. However, since there are now two main amplifiers 204, 254, the controller 260 reacts to the main amplifier 204 or 254 which requires the greatest output, and causes the power boost amplifiers 220, 230 to provide the required supply voltage based thereon. The controller 260 reacts to whichever amplifier output signal 205, 255 is greater in magnitude, and provides the greater of the two amplifier output signals 205, 255 in a positive direction over control line 261 to the first power boost amplifier 220, and the greater of the two amplifier output signals 205, 255 in a negative direction over control line 262 to the second power boost amplifier 230. The positive and negative power supply input boost signals are therefore independently activated. Both the positive and negative power supply input boost signals can be active at the same time.

Figure 3:
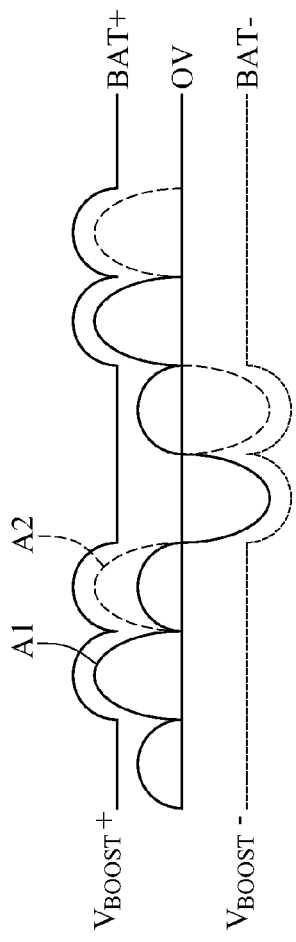
FIG. 3 is a graph illustrating waveforms relating to an example of operation of the power amplifier of FIG. 2.

Further explanation of the operation of the amplification system 200 of FIG. 2 may be made with reference to FIG. 3, which illustrates various simplified waveforms according to one particular example. In FIG. 3, the solid waveform line denoted "A1" represents the output signal 205 from the first main amplifier 204, the dotted waveform line denoted "A2" represents the output signal 255 from the second main amplifier 254, and the solid and dotted lines denoted Vboost+ and Vboost−, respectively, represent the power supply input signals 207, 208 having the same designations in FIG. 2. As shown in FIG. 3, when the voltage level of one of the output signals 205, 255 approaches the positive supply rail voltage, denoted BAT+, the positive power supply input signal Vboost+ tracks it and stays above the output signal level by some offset amount. In a practical implementation, there may be some droop or decay of the offset level over time, and later embodiments described herein are addressed to techniques for mitigating the effect of any droop or decay. Likewise, when the voltage level of one of the output signals 205, 255 approaches the negative supply rail voltage, denoted BAT−, the negative power supply input signal Vboost− tracks it and stays beyond the output signal level by some offset amount, possibly subject to potential decay or droop as later described herein. As illustrated in FIG. 3, the amplifier output signal 205, 255 having the greatest magnitude at a given time determines whether or not a boost signal will be provided. Since amplifier output signals 205, 255 can be of different polarities at a given time, it is possible that boost signals for both the positive and negative power supply rails will be generated at the same time.

Because the power supply level to both main amplifiers 204, 254 is determined based on the one requiring the greatest output, there may be an occasional loss of some overall efficiency as a higher voltage input will be supplied to one of the main amplifiers 204, 254 from time to time. Although there is a loss in some overall efficiency, the amplification system 200 depicted in FIG. 2 is still a substantial improvement in terms of efficiency over conventional amplifiers.

Figure 4:
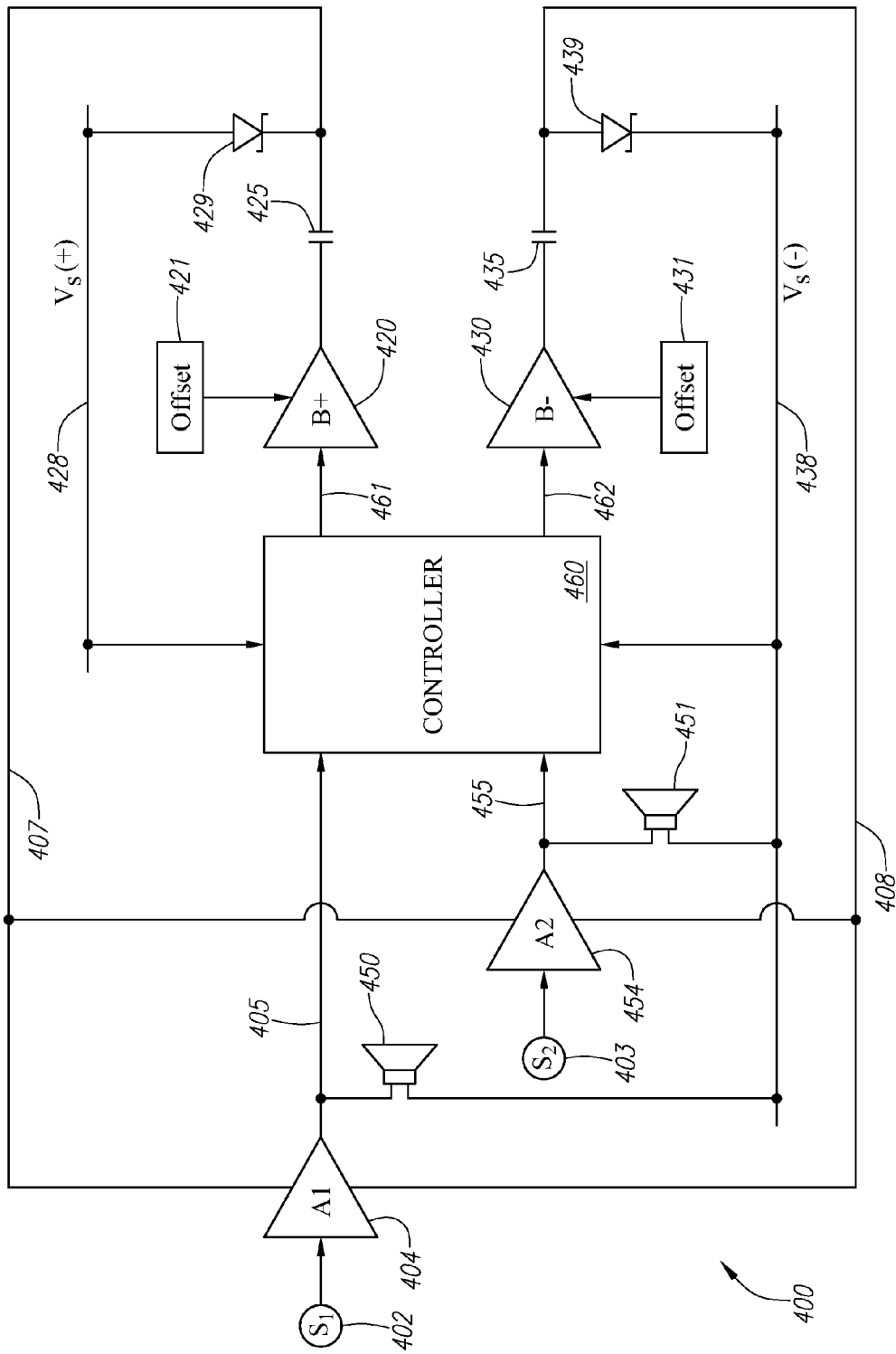
FIG. 4 is a more detailed diagram of a particular power amplifier including power rail boost circuitry, in accordance with various principles illustrated in or discussed with respect to FIG. 2.

FIG. 4 illustrates another embodiment of an amplification system 400 in general accordance with the principles of FIG. 2, but showing some additional details. In FIG. 2, components labeled "4xx" correspond to the components labeled "2xx" in FIG. 2. However, FIG. 4 also depicts the reservoir capacitors 425, 435, diodes 429, 439, and offset circuits 421, 431 which are illustrated and explained in FIG. 1, and which serve the same purpose as the components shown in FIG. 1. While not depicted in FIG. 4, coupling capacitors may also be provided from output signals 405 and 455 to the respective loudspeakers 450 and 451, as with FIG. 1.

With the amplification systems shown in FIGS. 1, 2 and 4, and elsewhere herein, the gain of power boost amplifiers B+ and B− may be set to unity, which generally will maintain a constant differential between the output of the main amplifier A1 (or main amplifiers, in a multi-channel or multi-amplifier system) and its supply terminals once the power boost amplifiers B+ or B− come into operation. In certain amplification systems, it may be found advantageous to have a greater voltage differential at higher output levels—for example, to maximize the current gain of the output transistors. Accordingly, the gain of the power boost amplifiers B+ and B− in the various embodiments described herein can be set at slightly greater than unity, in which case the voltage differential will increase with the main amplifier's output signal level. The gain of the power boost amplifiers, B+ and B−, may also be made non-linear to maximize this effect so that the main amplifier(s) A1 and/or A2 can swing close to the positive and negative supply rails, Vs+ and Vs−, before the power boost amplifiers B+ and B− come into operation, thus maximizing the efficiency of the main amplifier(s) A1 and/or A2, yet ensuring sufficient differential across the main amplifier(s) A1 and/or A2 when it is required to deliver high currents.

As previously indicated, in certain circumstances, there may be limitations in performance of the amplification system(s) heretofore described if prolonged high output is needed, such that voltage decay or droop from the reservoir capacitors begins to make a noticeable impact. When the power supply rails to the main amplifier(s) are being boosted, the current for the main amplifier(s) is being supplied via one of the reservoir capacitors (C1 or C2 in FIG. 1). Supplying the power boost reduces the charge stored in the reservoir capacitor being tapped, and the voltage across the reservoir capacitor decreases. If the power boost is required for a significant period of time, the voltage drop becomes a significant fraction of the peak stored voltage, and the output capability of the amplifier generally decreases. This in turn reduces the output voltage swing for low frequency signals. If the fall in voltage across the reservoir capacitor is sufficient that the main amplifier (e.g., A1) clips before the power boost amplifier B+ or B− has swung fully to the positive or negative voltage supply rail, Vs+ or Vs− as the case may be, then the output of the main amplifier will stop rising, and so too will the output of the power boost amplifier B+ or B−. The voltage across the reservoir capacitor will continue to fall so long as current is still being drawn from it, and so Vboost+/− will start to fall and with it, as will the output of the main amplifier. This fall is communicated to the power boost amplifier, B+ or B−, and a positive feedback action may occur, with the output voltage quickly collapsing. This situation can be prevented with appropriate protection circuitry that can, for example, limit the input voltage under such circumstances.

Figure 5:
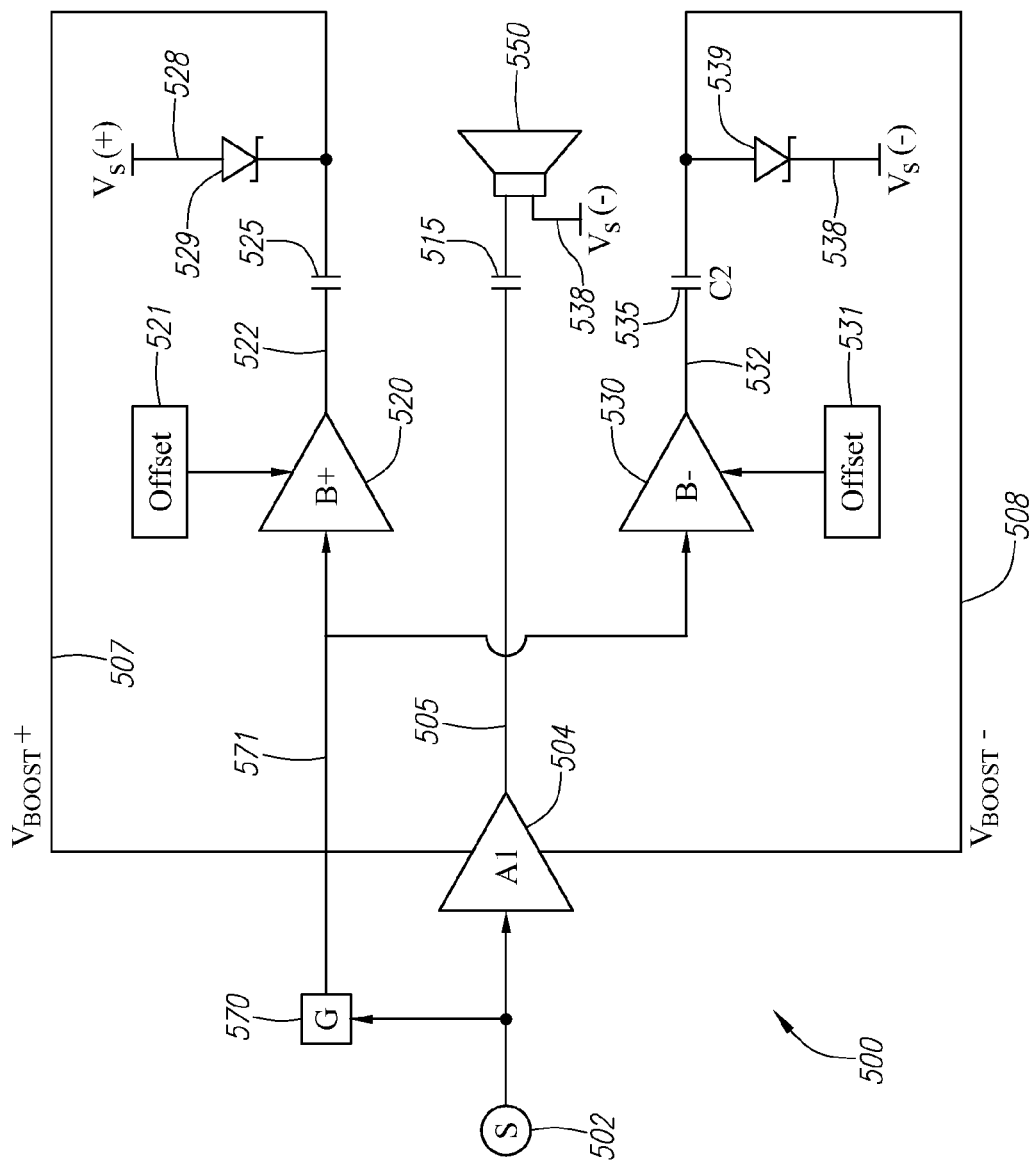
FIG. 5 is a diagram of another embodiment of a single-channel power amplifier including power rail boost circuitry.

An alternative technique to handling such a situation is illustrated in FIG. 5. In the embodiment illustrated in FIG. 5, components labeled "5xx" generally correspond to the same components labeled "1xx" in FIG. 1. However, instead of sensing the output of the main amplifier A1 (denoted 504 in FIGS. 5, and 104 in FIG. 1) in order to derive the appropriate drive signals for power boost amplifiers 520 and 530 (i.e., B+ and B−), the input source signal 502 to the main amplifier 504 is sensed instead, via a gain block 570 preferably having the same gain characteristics as the main amplifier 504, and the output 571 from gain block 570 is provided as an input to the power boost amplifiers 520, 530. This configuration breaks the potential positive feedback loop caused by the decay of voltage across the reservoir capacitors 525, 535, and prevents the collapse of the output when the voltage across the reservoir capacitor 525 or 535 drops too much. The output of the main amplifier 504 may still clip, but it will then generally follow the discharge of the reservoir capacitor 525 or 535 rather than fall quickly to zero. While gain block 570 is illustrated as a separate block in FIG. 5, it may be incorporated into the individual power boost amplifiers 520 and 530.

Figure 6:
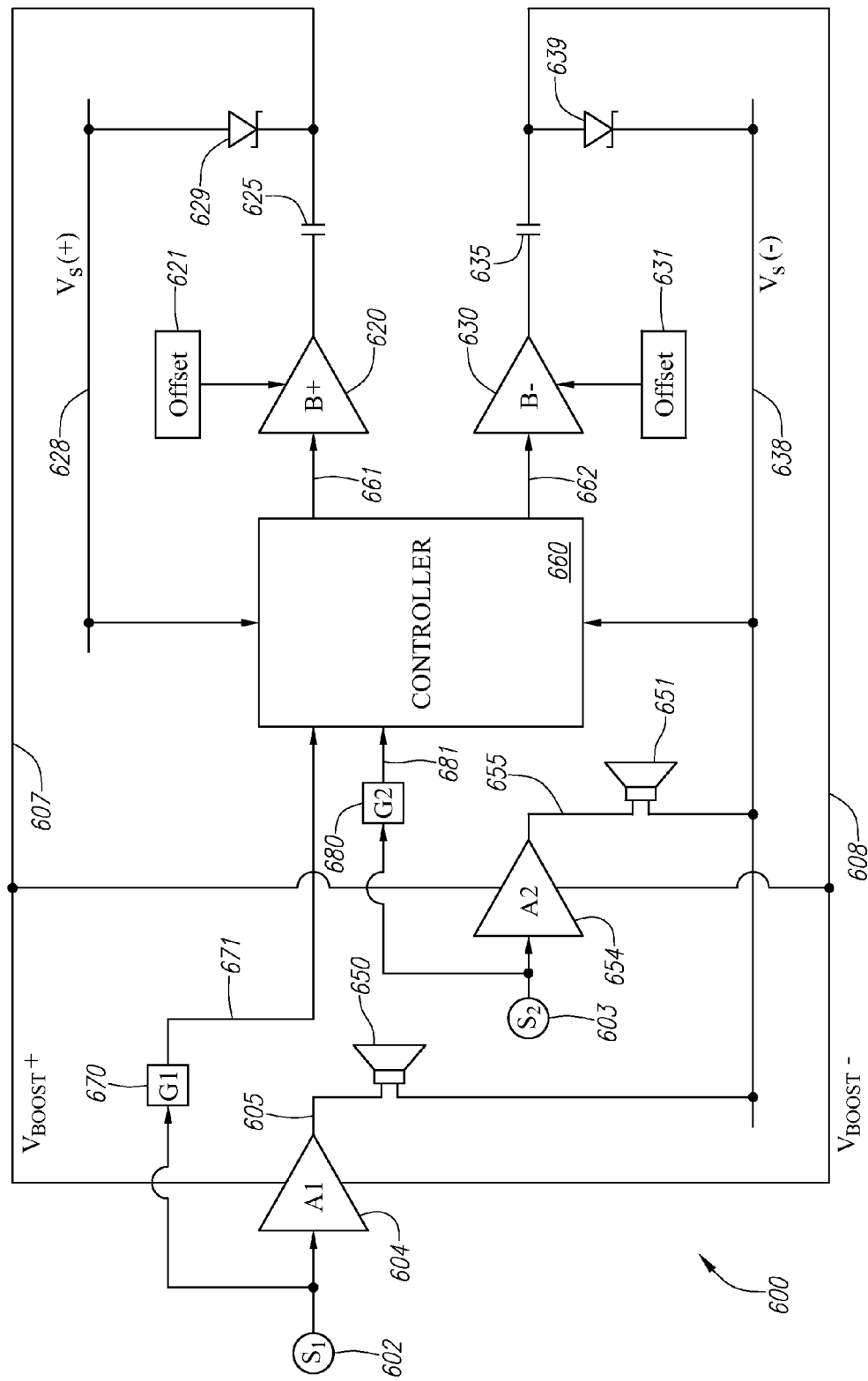
FIG. 6 is a diagram of an embodiment of a dual-channel power amplifier including power rail boost circuitry.

A similar scheme can also be applied to a multi-channel system, as shown, for example, in FIG. 6. In the embodiment illustrated in FIG. 6, components labeled "6xx" generally correspond to the same components labeled "4xx" in FIG. 4. However, like the embodiment of FIG. 5, instead of sensing the outputs of the main amplifiers A1 and A2 in order to derive the appropriate drive signals for power boost amplifiers 620 and 630 (i.e., B+ and B−), the input source signals 602, 603 to the main amplifiers 604, 654 are individually sensed instead, via gain blocks 670 and 680, and the outputs 671, 681 from the gain blocks 670, 680 are provided to controller 660 which in turn provides the appropriate input signals 661, 662 to the power boost amplifiers 620, 630. Analogous to the embodiments of FIGS. 2 and 4, which use the outputs of main amplifiers A1 and A2, the greater of gain block output signals 671, 681 derived from input source signals 602, 603 will be passed along to the power boost amplifiers 661, 662. The main amplifiers 604, 654 may have different gains, provided that either the gain blocks 670, 680 or the controller 660 take account of this fact.

Figure 7A:
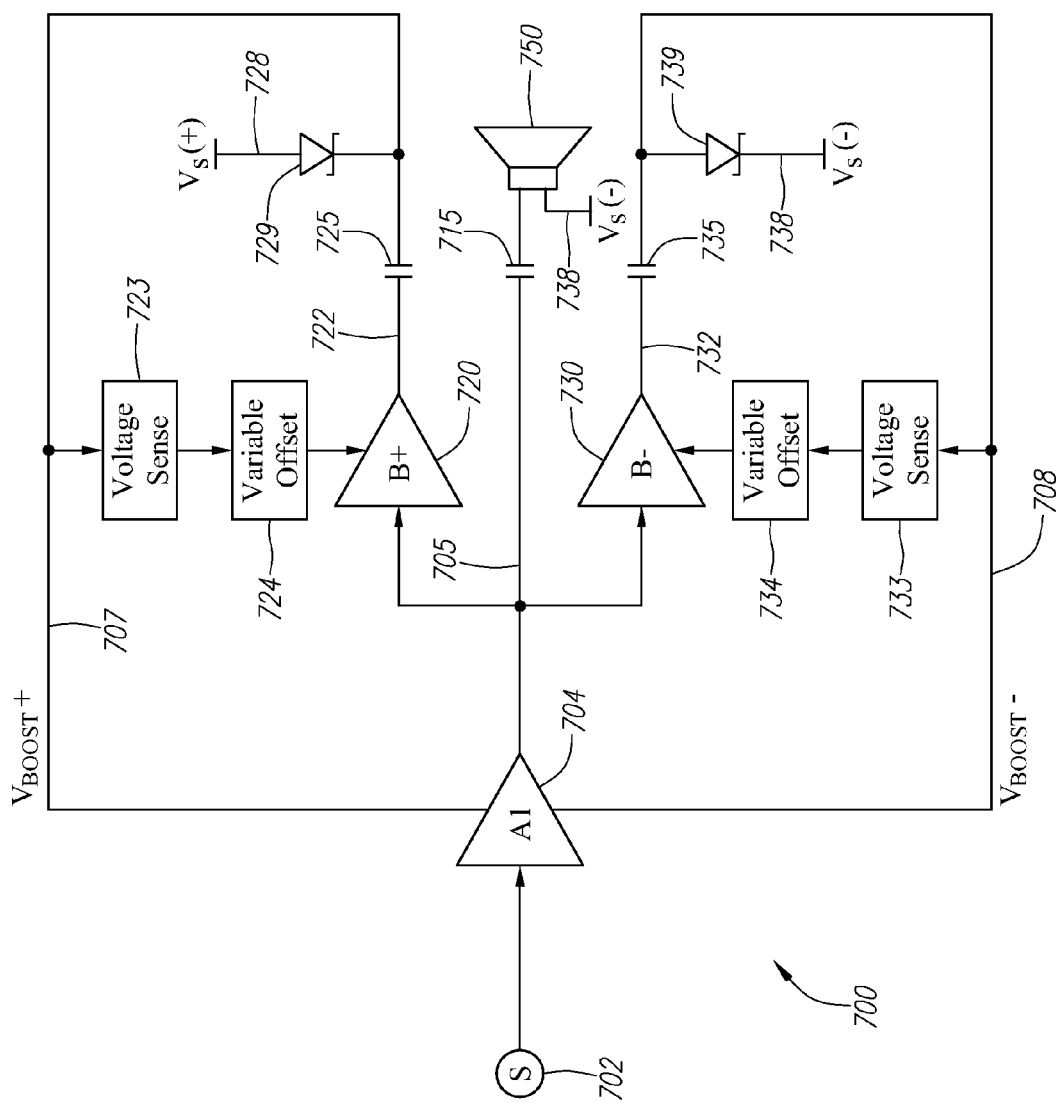
FIG. 7A is a diagram of another embodiment of a single-channel power amplifier including power rail boost circuitry, and which adjusts for decay or droop.

Yet another technique to avoid the previously described overload problem, but while avoiding the potential need to match the gain of power boost amplifiers B+ and B− to be approximately the same as the main amplifier A1, is shown in FIG. 7A. In the embodiment illustrated in FIG. 7A, components labeled "7xx" generally correspond to the same components labeled "5xx" in FIG. 5. The general premise behind the approach of the amplification system 700 in FIG. 7A is to sense directly the difference between the output voltage of the main amplifier 704 and its supply voltage, and to drive the output of the power boost amplifiers 720, 730 in such a way as to keep this difference constant (in the simplest implementation, at least). To this end, the power boost amplifiers 720, 730 are preferably implemented as high gain type amplifiers and incorporate the output and power supply terminals of the main amplifier 704 in a negative feedback loop.

In this embodiment, positive supply voltage sense circuit 723 and negative supply voltage sense circuit 733 sense the levels of the positive and negative supply voltages, respectively. These values are combined with the normal fixed offset, to arrive at a variable offset value, as reflected by variable offset circuits 724, 734 depicted in FIG. 7A. The negative feedback loop comes into operation once the output of the main amplifier 704 reaches to within a predetermined voltage difference from the power supply rail. At low output levels, power boost amplifiers 720, 730 are held at the positive and negative supply rails, Vs+ and Vs− respectively, as in the previous embodiments, and the main amplifier 704 operates from the power supply rails Vs+ and Vs− as a normal amplifier. But as soon as the output of the main amplifier 704 reaches to within a certain amount (e.g., 1.5 Volts) of the positive supply rail Vs+, then the feedback loop starts to drive the output of power boost amplifier 720 positive (a similar phenomenon occurs with respect to the other power boost amplifier 730 when the output of the main amplifier 704 reaches within a certain amount of the negative supply rail Vs−). This action drives the power supply input signal 707, or Vboost+, in a positive direction, via reservoir capacitor 725, which therefore acts to reduce the difference voltage between the output 705 of the main amplifier 704 and its positive power supply input 707. This effect, in turn, reduces the drive signal into the positive side power boost amplifier 720.

The foregoing effects result from the action of the negative feedback loop, and provided that the loop is designed to be stable, act to prevent the difference between the output 705 of the main amplifier 704 and its positive supply voltage falling below the reference level. The voltage level of the output signal 705 of the main amplifier 704 is determined by the signal applied to its input, as is normal for an amplifier in its linear region of operation, so the action of the feedback loop once operational is to allow the power supply voltage to track at a predetermined offset (e.g., 1.5 Volts) above the output voltage of the main amplifier 704. As a result, the main amplifier 704 does not clip, and continues to drive an increasing voltage into the load so long as the power boost amplifiers 720, 730 are not clipping. The effect therefore is similar to the previous embodiments with respect to increased output capability and ultimate clipping levels and efficiency of the main amplifier 704; however, there is no need to match the gain of the power boost amplifiers 720, 730 to that of the main amplifier 704.

Ideally, the gain of power boost amplifiers 720, 730 would be infinite if the difference voltage is to be maintained at a constant level. This, however, is impractical, and with a finite gain the voltage difference will decrease at large voltage swings. Such a situation is typically the opposite of what is desired. Rather, it is often preferable to have the voltage difference increase at high output levels. Such an effect can be achieved with a slight modification to the amplification system 700 of FIG. 7A. As previously explained, the system 700 illustrated in FIG. 7A senses the difference between the output of the main amplifier 704 and its supply terminals, and acts to prevent this difference falling below a certain reference level. If instead of a constant reference level, the reference is made to increase in proportion with the output level, as implemented in variable offset circuits 724, 734, then the effect will be to offset the error due to the finite gain of the power boost amplifiers 720, 730. If the proportionality constant is appropriately chosen, the effect of limited gain can be exactly cancelled so that the difference between the output 705 of the main amplifier 704 and its power supply terminals will be maintained at a constant voltage once the feedback loop operates. If the proportionality constant is higher than this amount, the voltage difference will increase with output level, mimicking the characteristic obtained with the original variation of the embodiment of FIG. 1 in which the power boost amplifiers 120 and 130 (B+ and B−) were given a gain of greater than unity.

The feedback arrangement described with respect to FIG. 7A also overcomes potential problems encountered with drooping of the reservoir capacitor voltage. Because the reservoir capacitors 725, 735 are enclosed within the feedback loop, the droop will initially have no effect. The power boost amplifier 720 or 730 will be automatically driven harder to compensate for the droop. Once the power boost amplifier 720 or 730 saturates at its supply rails, this correction will no longer occur, and the output of the main amplifier 704 will be driven into clipping, but there will generally not be a catastrophic collapse of output voltage.

The technique of FIG. 7A may be expanded to multichannel configurations, as illustrated, for example, in FIG. 8A, again allowing more than one main amplifier to be powered from one set of power boost amplifiers B+/B−. In the embodiment illustrated in FIG. 8A, components labeled "8xx" generally correspond to the same components labeled "6xx" in FIG. 6. Rather than sense the output of one amplifier and the supply voltage terminals to derive a difference voltage, as with FIG. 7A, the difference between the supply voltage and the largest output of any of the main amplifiers 804, 854 in FIG. 8A, as determined by controller 860, is used to drive the feedback loop. In this way, it can be ensured that the power supply voltage is always large enough to prevent any of the main amplifiers 804, 854 from clipping. As before, with the other multi-channel embodiments described herein, the main amplifiers with lower output voltage will end up with more than the necessary supply voltage and so their efficiency can suffer somewhat, but this will often be a more than acceptable trade-off.

Figure 7B:
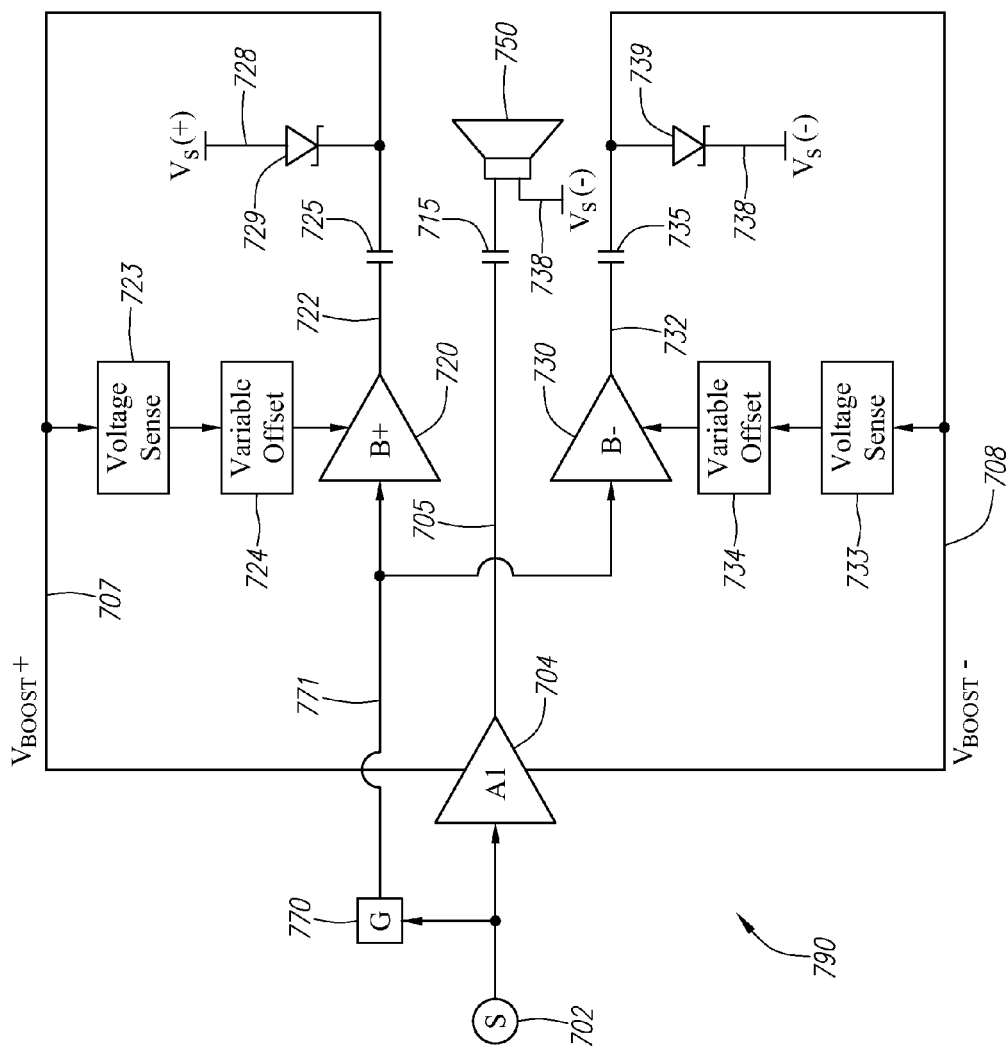
FIG. 7B depicts a variation of the amplifier of FIG. 7A which includes circuitry for sensing a difference between the supply voltage and an amplified version of the main amplifier input in order to drive the feedback loop.
Figure 8A:
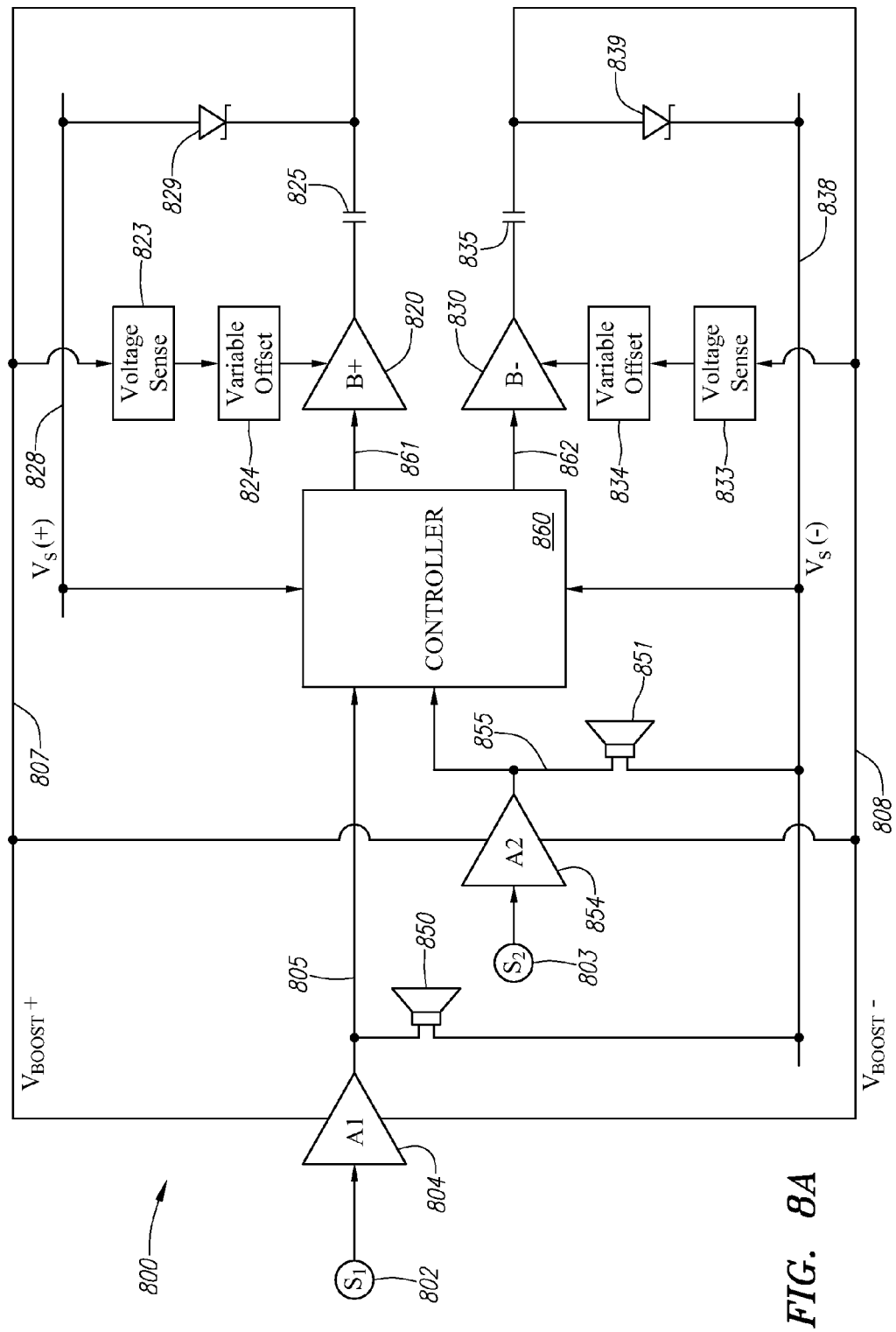
FIG. 8A is a diagram of a dual-channel power amplifier including power rail boost circuitry, which adjusts for decay or droop.
Figure 8B:
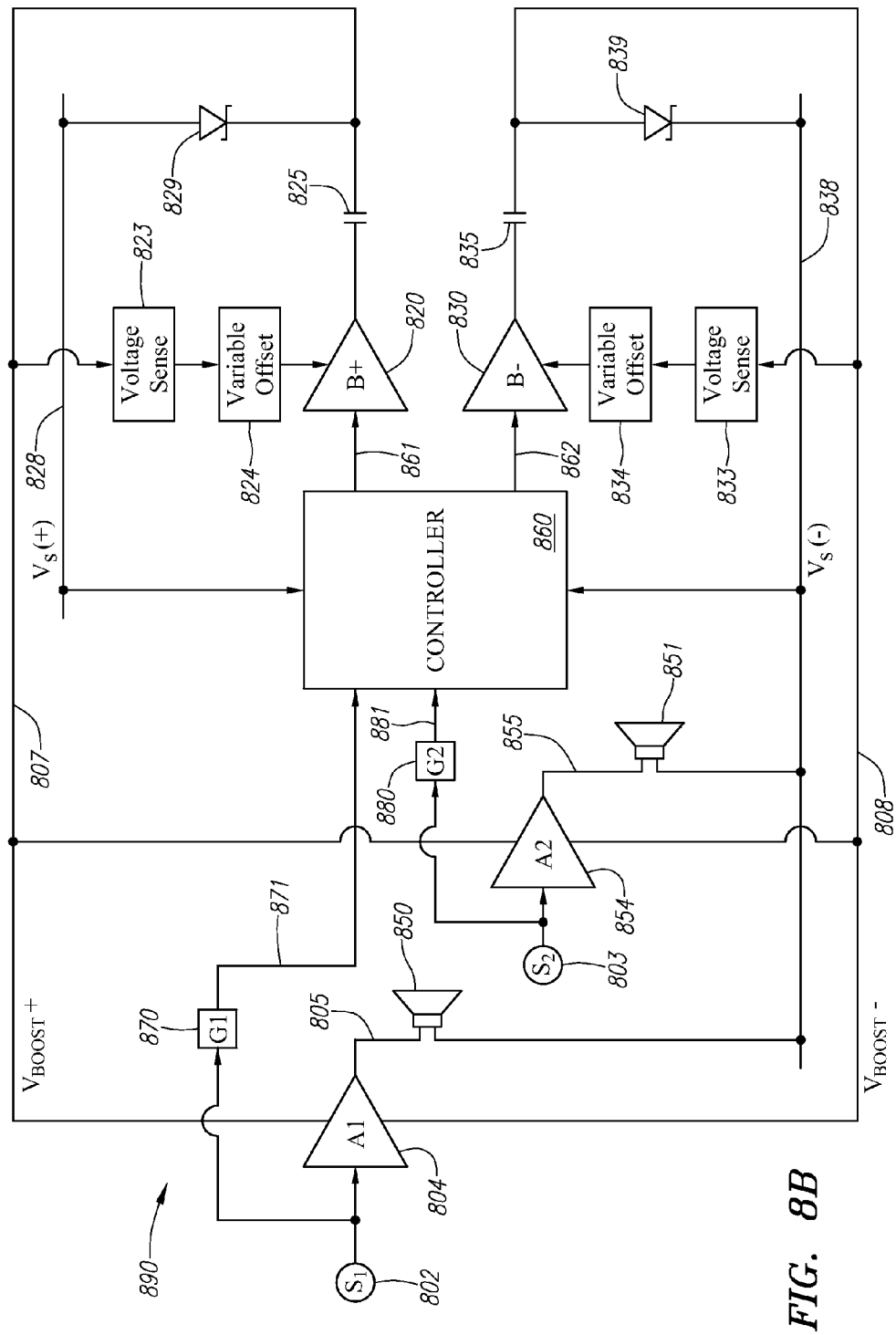
FIG. 8B depicts a variation of the amplifier of FIG. 8A which includes circuitry for sensing a difference between the supply voltage and an amplified version of the main amplifier input to drive the feedback loop.

A variation of the feedback approach described with respect to FIGS. 7A and 8A can also be adopted whereby rather than sensing the difference between the supply voltage and the output of the main amplifier(s), the difference between the supply voltage and a suitably amplified version of the input to the main amplifier(s) is instead used to drive the feedback loop (see FIGS. 7B and 8B, corresponding to modified versions of FIGS. 7A and 8A respectively). Thus, in FIG. 7B, the power amplifier 790 includes a gain stage 770 having gain G for amplifying the input signal 702, and the amplified input signal 771 is provided to power boost amplifiers 720, 730 instead of the main amplifier output 705. Similarly, in FIG. 8B, the power amplifier 890 includes gain stages 870, 880 having gain factors G1, G2 respectively, for amplifying the input signals 802 and 803, and the amplified input signals 871 and 881 are provided to controller 860, which operates as previously described. Such an approach may be somewhat more complex in certain respects, but may make stabilization of the feedback loop easier with some amplifier types.

Figure 9:
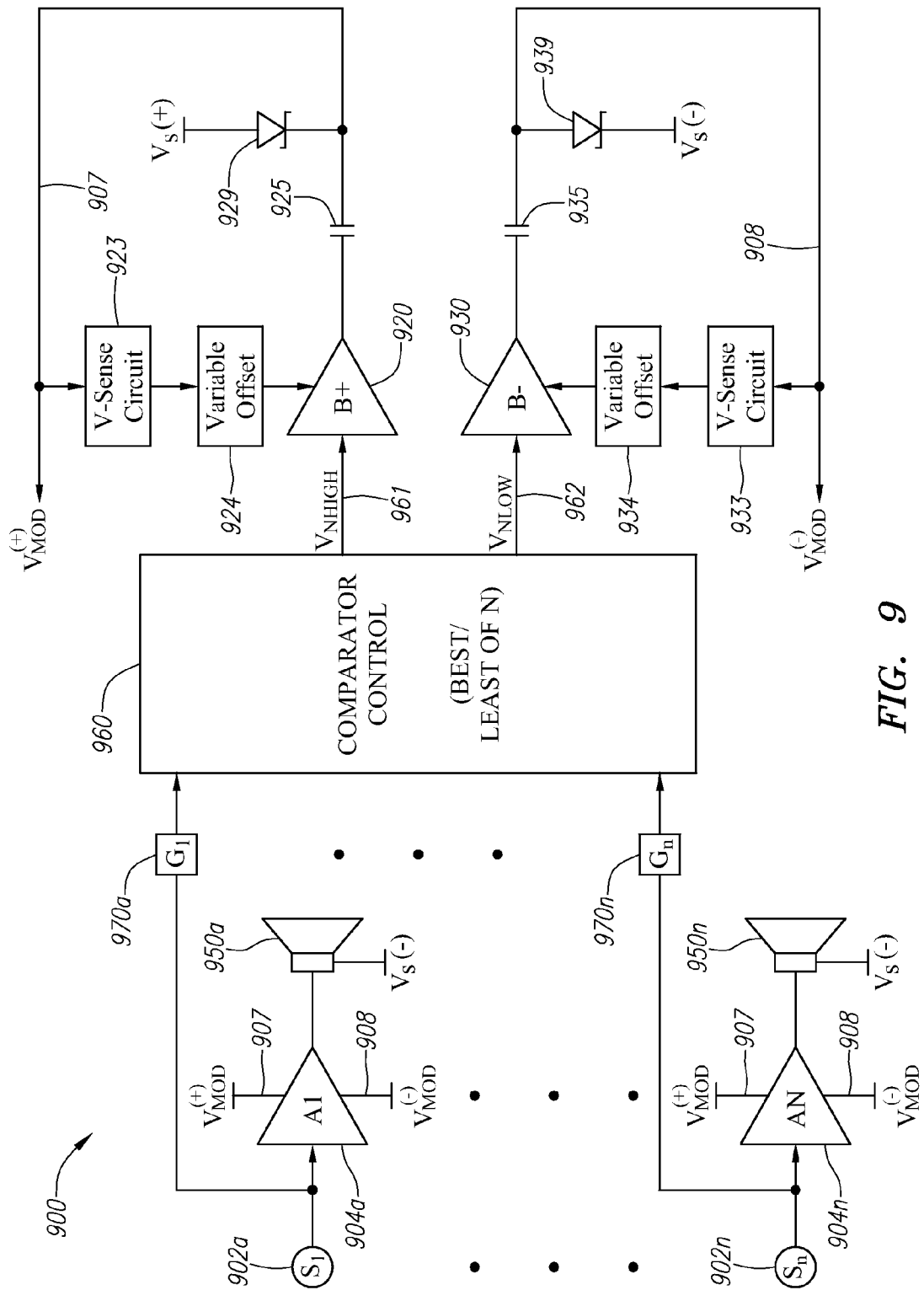
FIG. 9 is a diagram of an embodiment of an N-channel power amplifier including power rail boost circuitry, in accordance with one or more embodiments as disclosed herein.
Figure 10:
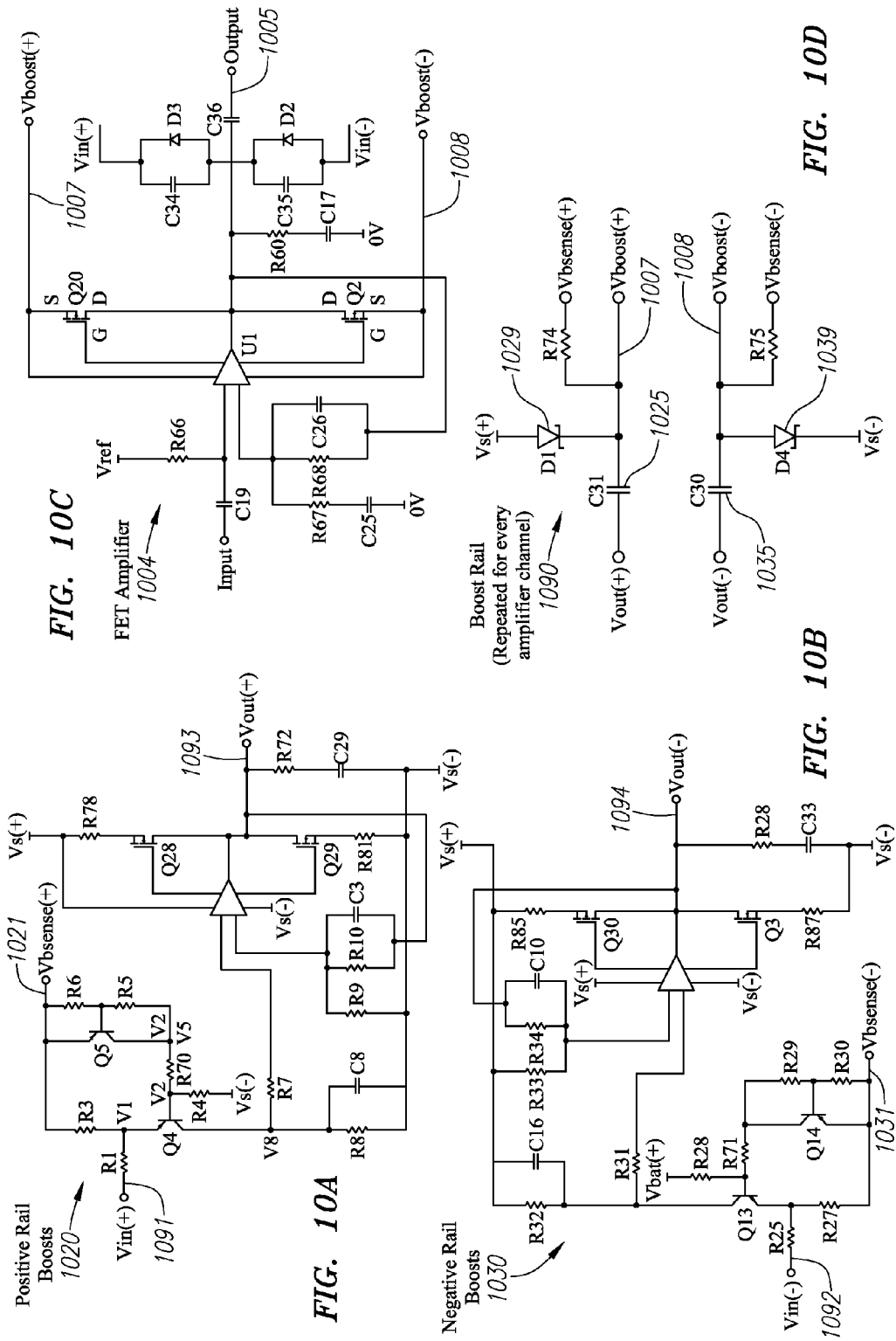
FIGS. 10A-10D are detailed circuit schematics of a particular embodiment of a power amplifier including power rail boost circuitry.

FIG. 9 shows an embodiment employing the feedback control approach of FIG. 8B expanded to the general case of N amplifiers 904a . . . n, still using one set of power boost amplifiers 920, 930. In FIG. 9, components labeled "9xx" generally correspond to the same components labeled "8xx" in FIG. 8B (but with duplicate components labeled with added reference labels "a" . . . "n"). Rather than obtaining the largest output from two amplifiers, as in FIG. 8B, the amplification system in FIG. 9 includes a comparator control circuit 960 which determines the largest positive magnitude voltage ("best-of-N") from the various amplifier outputs 905a . . . n, and the largest negative magnitude voltage ("least-of-N") from the various amplifier outputs 905a . . . n, and provides these values (denoted $V_{NHIGH}$ and $V_{NLOW}$ in FIG. 9) to the power boost amplifiers 920, 930. The difference between the positive or negative supply voltages and the largest positive/negative output of any of the main amplifiers 904a . . . n in FIG. 9 is used to drive the feedback loop. In this way, it can be ensured that the power supply voltage is always large enough to prevent any of the main amplifiers 904a . . . n from clipping.

As before, with the other multi-channel embodiments described herein, the main amplifiers 904 with lower output voltage will typically end up with more than the necessary supply voltage and so their efficiency can suffer somewhat, but this will often be an acceptable trade-off. Also, although FIG. 9 illustrates an example using input sensing, the expansion to the general case of N amplifiers applies equally to an output sensing approach.

FIGS. 10A-10D are detailed circuit schematics of one embodiment of a power amplifier circuit. There, a main amplifier 1004 (in this example, a FET) is supplied as necessary by positive power boost amplifier 1020 and negative power boost amplifier 1030, which output a positive supply voltage signal (Vboost+) 1007 and negative supply voltage signal (Vboost−) 1008, respectively. The main amplifier 1004, positive power boost amplifier 1020, and negative power boost amplifier 1030 are generally analogous to main amplifier 704 (A1) and power boost amplifiers 720 (B+), 730 (B−) depicted in FIG. 7, and serve a similar purpose. The positive power boost amplifier 1020 receives an input signal (Vin(+)) 1091 derived from the output 1005 of the main amplifier 1004, and the negative power boost amplifier 1030 receives an input signal (Vin(−)) 1092 also derived from the output 1005 of the main amplifier 1004. The positive power boost amplifier 1020 senses the positive supply voltage signal (Vboost+) 1007 on a positive boost voltage sense line 1021, and generates a positive rail boost control signal 1093 which controls the amount of boost provided by reservoir capacitor 1025. Likewise, the negative power boost amplifier 1030 senses the negative supply voltage signal (Vboost−) 1008 on a negative boost voltage sense line 1031, and generates a negative rail boost control signal 1094 which controls the amount of boost provided by reservoir capacitor 1035. Detail inset 1090 illustrates positive and negative rail boost control signals 1093, 1094 as applied to reservoir capacitors 1025, 1035, respectively, along with diodes 1029, 1039 as previously described with respect to prior embodiments disclosed herein. It also illustrates sense resistors R74, R75 which are used to derive the positive and negative boost voltage sense lines 1021, 1031.

Figure 11:
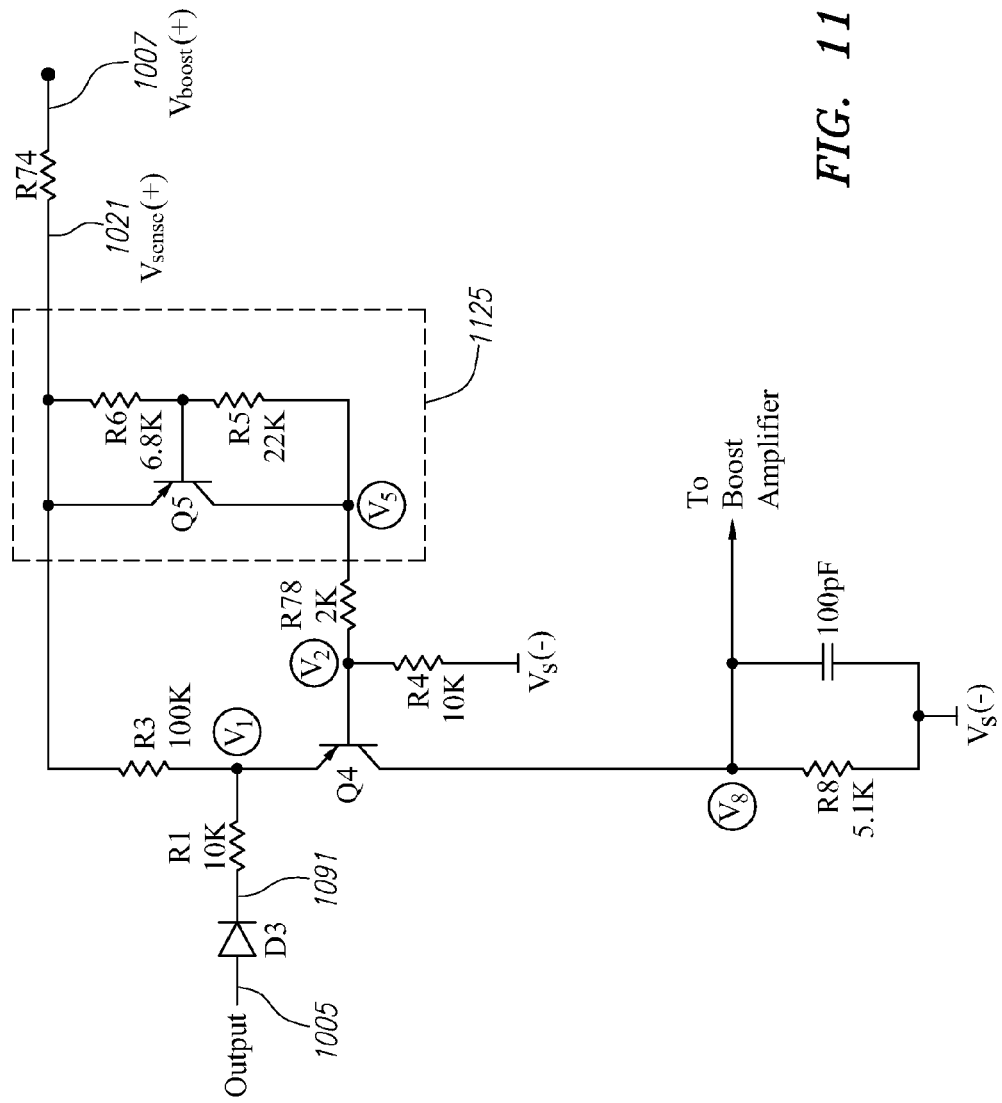
FIG. 11 is a circuit schematic diagram illustrating a portion of the positive rail booster from FIGS. 10A-10D.
Figure 12:
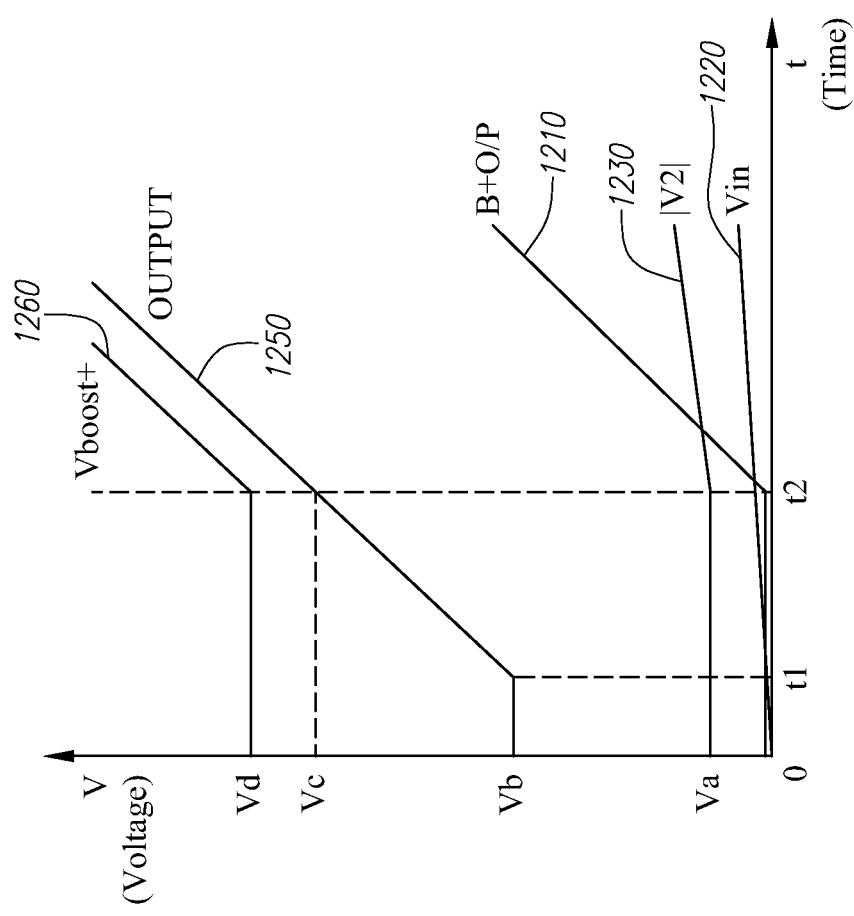
FIG. 12 is a graph illustrating an example of certain voltage waveforms and relationship pertaining to operation of the power boost circuitry of FIGS. 10A-10D and 11.

Operation of the circuitry FIGS. 10A-10D may be explained in greater depth with reference to FIG. 11, which shows certain details of the positive power boost amplifier 1020 in FIGS. 10A-10D, along with the associated graph in FIG. 12, with it being understood that the negative power boost amplifier 1030 operates in analogous fashion. FIG. 11 generally shows the output sensing circuitry designed to drive the booster amplifiers of FIGS. 10A-10D, while FIG. 12 illustrates certain voltage waveforms at various points of the circuit and at various points in time. In FIG. 11, transistor Q5 and resistors R5, R6 form what is generally referred to as an "amplified diode" voltage reference 1125 that maintains a nominally constant voltage differential from positive supply voltage signal (Vboost+) 1007, as sensed on line 1021, to node V5. Resistors R4 and R78 provide a bias current to this voltage reference 1125, but also add in a component of the sensed boost voltage (Vsense+) at node V2. Thus, the emitter voltage of transistor Q4 is held at a voltage below Vboost+ that has a fixed component plus a predetermined component proportional to Vboost+. The emitter of transistor Q4 is connected to the amplifier output 1005 via diode D3 and resistor R1. The collector of transistor Q4 is connected to the input of the boost amplifier (e.g., amplifier 720 (B+) of FIG. 7).

Initially, under quiescent conditions, the sensed boost voltage (Vsense+) 1021 is held at a diode drop below the power supply source voltage Vs+ via diode 1029 (see FIGS. 10A-10D, inset 1090) while diode D3 is reversed biased. At this time, only a small current flows through transistor Q4 via resistor R3, sufficient to just maintain the positive power boost amplifier 1020 in its linear region to speed up its response time, but small enough so that the output of the power boost amplifier 1020 is very close to the negative supply source voltage Vs− (as shown by waveform 1210 in FIG. 12 reflecting the output of the positive power boost amplifier 1020 over time, as the input voltage increases). As the input voltage of the source signal rises, as illustrated by waveform 1220 in FIG. 12, the output voltage of the main amplifier 1004 also rises positively towards Vboost+ beginning at time t1 in FIG. 12, as illustrated by waveform 1250 in FIG. 12. Initially, the state of the circuit does not change as diode D3 is still reverse biased. However, when the output voltage of main amplifier 1004 rises one diode drop above the voltage at transistor Q4's emitter, which occurs at time t2 in FIG. 12, the main amplifier 1004 drives current through transistor Q4 to increase the voltage at node V8 (FIG. 11) and so cause the output of the positive power boost amplifier 1020 to rise, as again shown by waveform 1210 in FIG. 12.

The voltage increase at node V8 is transmitted through reservoir capacitor 1025 to the positive supply voltage signal (Vboost+), which is shown by waveform 1260 in FIG. 12. The rise in Vboost+ reverse biases diode 1029, thereby the positive supply rail to the main amplifier 1004 is now being boosted. This rise in Vboost+ causes the emitter voltage of transistor Q4 to rise due to the action of transistor Q5 and resistors R5, R6, R78 and R4 (that is, the amplified diode voltage reference 1125 and the variable component of Vboost+), as shown by waveform 1230 in FIG. 12, thus reducing the current through diode D3 and resistor R1. This constitutes a negative feedback action and, provided that the loop is stable and the gain around the loop is high enough, the action of the loop will be to maintain the voltage differential between transistor Q4's emitter and Vboost+ at a level mathematically described as:

$$V\text{diff} = (V\text{boost}+) \cdot R78/(R4+R78) + V\text{ref}(R4/[R4+R78]) + V\text{be4}$$

where Vref represents the voltage at node V5, and Vbe4 represents the base-emitter voltage of transistor Q4. If the loop gain is high, then the current through resistor R1 is relatively small and therefore the output of power boost amplifier 1020 will move in such a manner as to maintain Vboost+ at approximately (Vdiff−Vd3) above the main amplifier's output voltage 1005, where Vd3 is the voltage drop across diode D3 in FIG. 11.

Thus, at low output voltages, the main amplifier 1004 works as a normal amplifier, but as soon as the predetermined threshold is crossed, the positive power boost amplifier 1020 comes into operation to prevent the main amplifier 1004 form clipping and to boost its positive power supply rail voltage, thus increasing its output capability. The negative power boost amplifier 1030 operates in a complementary fashion.

While exemplary values for certain circuit elements are depicted in FIG. 11, it should be understood that those values are for purposes of illustration only and are not intended to be limiting in any manner. Moreover, the additional details of the power boost amplifiers 1020, 1030 are not described in depth as they are generally based on known techniques that would be apparent to one skilled in the art, and as such it would be considered within the purview of those skilled in the art to use alternative amplifier designs and/or to modify or optimize the various features of power boost amplifiers 1020, 1030 depending on the specific application and system parameters.

Figure 13A:
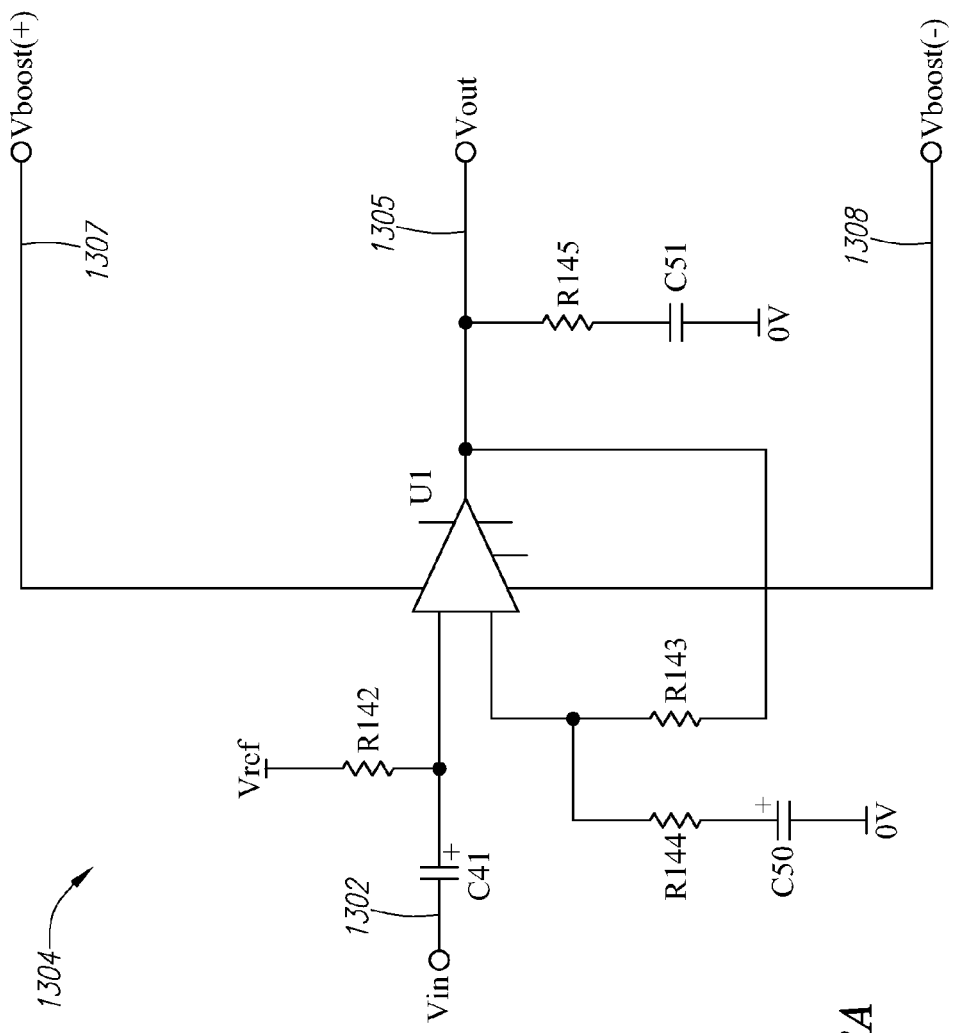

FIGS. 13A, 13B-1 and 13B-2 are detailed circuit schematics depicting another embodiment of a power amplifier including power rail boost circuitry. FIG. 13A illustrates a power amplifier 1304 that may be used, for example, in an audio amplification system or in other applications. The power amplifier 1304 is generally analogous to the main amplifiers previously discussed herein. It preferably employs a current dumping output design, and is optimized for low quiescent power. It preferably operates as a class B amplifier. The power amplifier 1304 receives an input source signal 1302 to be amplified, and outputs an amplified signal 1305 which is used by power boost amplifiers 1320, 1330 in FIG. 13B-1 and 13B-2 to generate boosted power supply rails 1307, 1308 when additional output power is necessary.

Figures 1, 2, 13B:
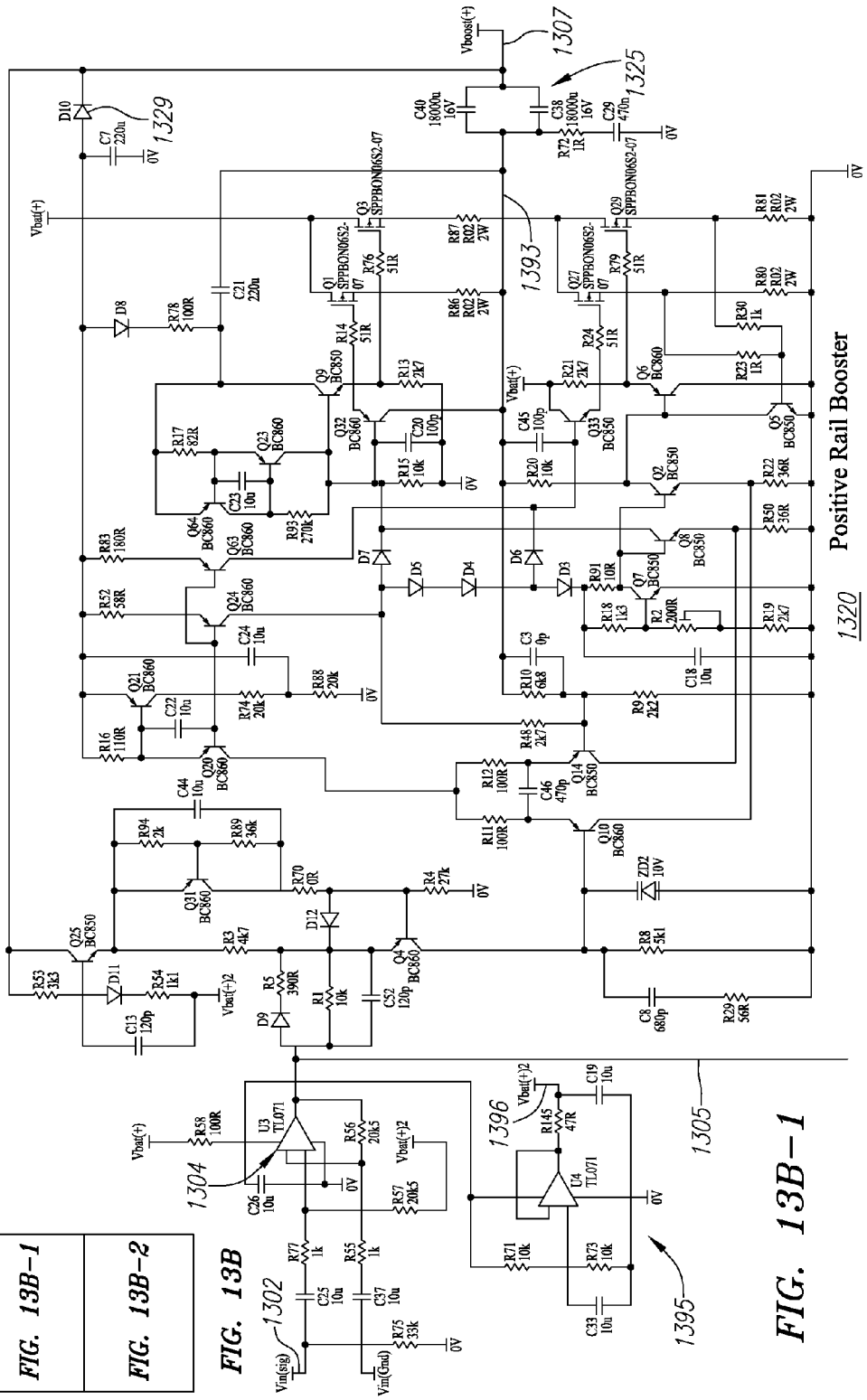
Figures 2, 13B:
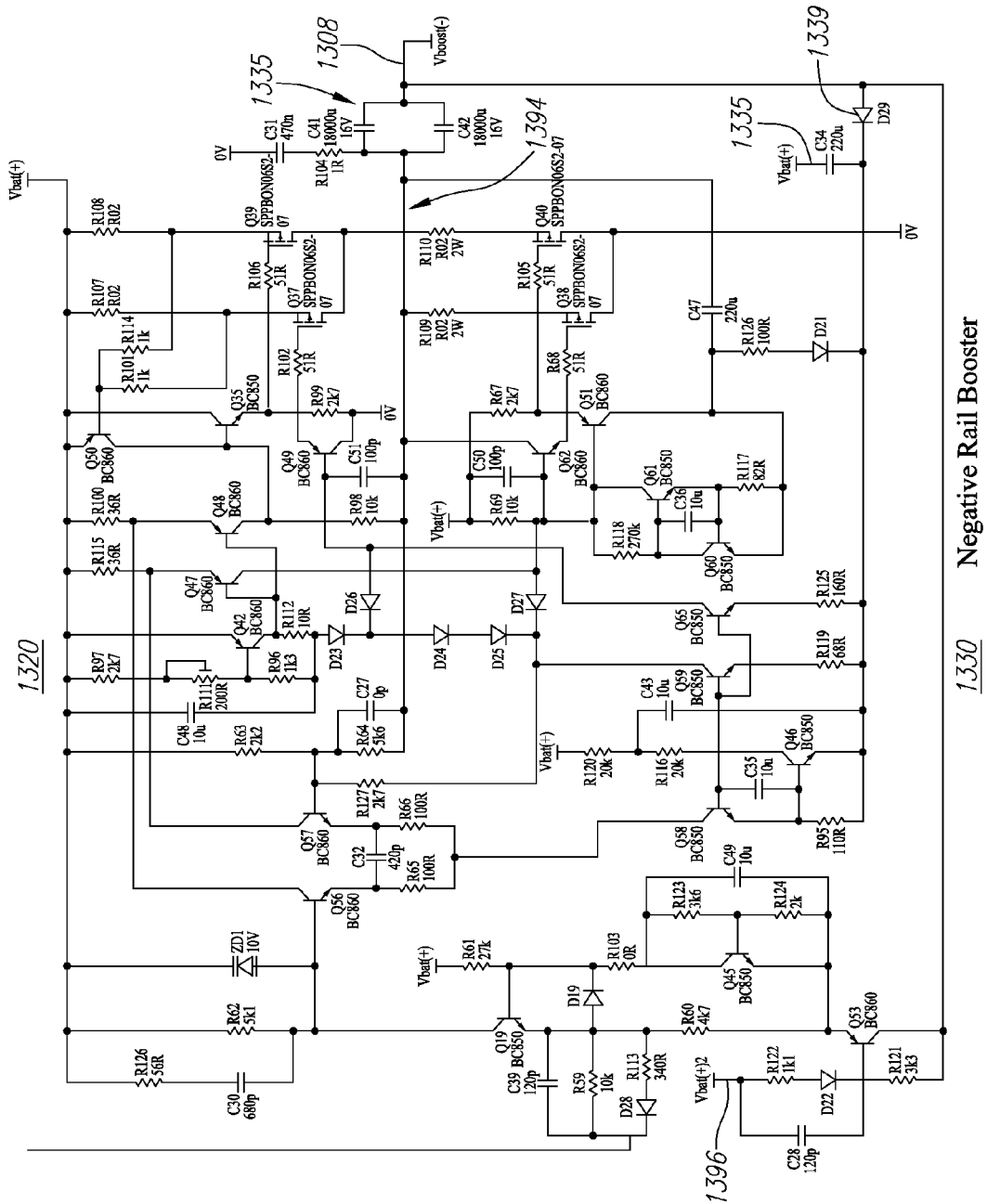

The circuitry in FIGS. 13B-1 and 13B-2 constitutes a class H power supply. In this particular example, the system operates with a single nominal 28 Volt DC input voltage (although it could equivalently operate with ±14 Volt DC inputs). The circuitry in FIGS. 13B-1 and 13B-2 generates ±40 Volt power supply rails when fully active, and may be used to power several amplifiers of the type illustrated in FIG. 13A. The operation of the circuitry in 13B-1 and 13B-2 is largely analogous to that of FIGS. 10A-10D and 11. However, there are some differences. In FIGS. 13B-1 and 13B-2, amplifier 1304 is shown receiving the input source signal 1302 and producing an amplified output signal 1305. Amplifier 1305 is an analog of the main amplifier of FIG. 13A with matching frequency response but reduced gain, analogous to the gain block G (720) in FIG. 7B. The positive power supply boost circuit 1320 and negative power supply boost circuit 1330 both receive the amplified output signal 1305 and, in response thereto, output power boost control signals 1393, 1394 respectively which provide a boosted power supply on lines 1307, 1308 as needed. The positive power boost control signal 1393 drives reservoir capacitor 1325 (which is physically a combination of two capacitors C38 and C40), while the negative power boost control signal 1394 drives reservoir capacitor 1335 (which is likewise physically a combination of two capacitors C41 and C42), all in a manner generally similar to the previously described embodiments.

Focusing now on the positive power boost circuit 1320 in particular, transistor Q4 serves the same general purpose as the similarly denoted component in FIGS. 10A-10D and 11. In addition to the feedback configuration in FIG. 11, the positive power boost circuit 1320 also uses transistor Q25 and associated circuitry to sense the positive supply voltage signal (Vboost+) 1307 and to set the gain to match the gain block 1304 output, so that its output swing can be reduced. An analogous operation occurs with respect to the negative power boost circuit 1330 and the negative supply voltage signal (Vboost−) 1308.

The power boost circuitry in FIG. 13B-1 and 13B-2 can be used to powers multiple amplifiers of the type illustrated in FIG. 13A. It can also be remotely located with respect to those amplifiers, i.e., the output stages, thereby increasing flexibility of deployment options.

As before, while exemplary values for certain circuit elements are depicted in FIGS. 13A, 13B-1 and 13B-2, it should be understood that those values are for purposes of illustration only and are not intended to be limiting in any manner. Moreover, an in-depth explanation of the details of the amplifier circuitry within power boost circuits 1320, 1330 is not deemed necessary as such details are considered within the purview of those skilled in the art, and are not necessary to an understanding of the basic operation of the power boost circuits 1320, 1330.

One possible drawback of a voltage boosting scheme is that when the boost phase is finished, the boost amplifier attempts to re-charge the reservoir capacitor to replenish the charge lost during the boost phase. As this happens, there can be a large initial surge of current into the capacitor and this can cause a voltage spike on the power supply lines, which can then potentiallly couple into the amplifiers and cause distortion. To avoid this potential problem, the boost amplifier current output capability can be limited to reduce the severity of any such spikes. The current limiting level is preferably set so that the reservoir capacitor can still be re-charged adequately fast enough.

This approach can be further extended to shape the charging current profile by employing a voltage-controlled current limiting operation. In this case, the amplifier output voltage level can be used to control the current limit so that when the amplifier first exits the boost phase, the charging current is set at a nominal level. As the amplifier output returns towards its quiescent state, the charging current is increased. By this means, the charging current profile is spread out and causes less severe spike on the supplies.

Extending this concept even further, the charging of the reservoir capacitor can be delayed until the amplifier output begins to approach the opposite voltage rail. This helps to ensure that any spikes on, e.g., the positive rail due to capacitor charging would not occur until the positive swinging half of a Class B or AB amplifier was cut off. The likelihood of any positive rail spikes coupling through the amplifier to the output would thus be reduced, thereby lowering distortion.

Figure 14:
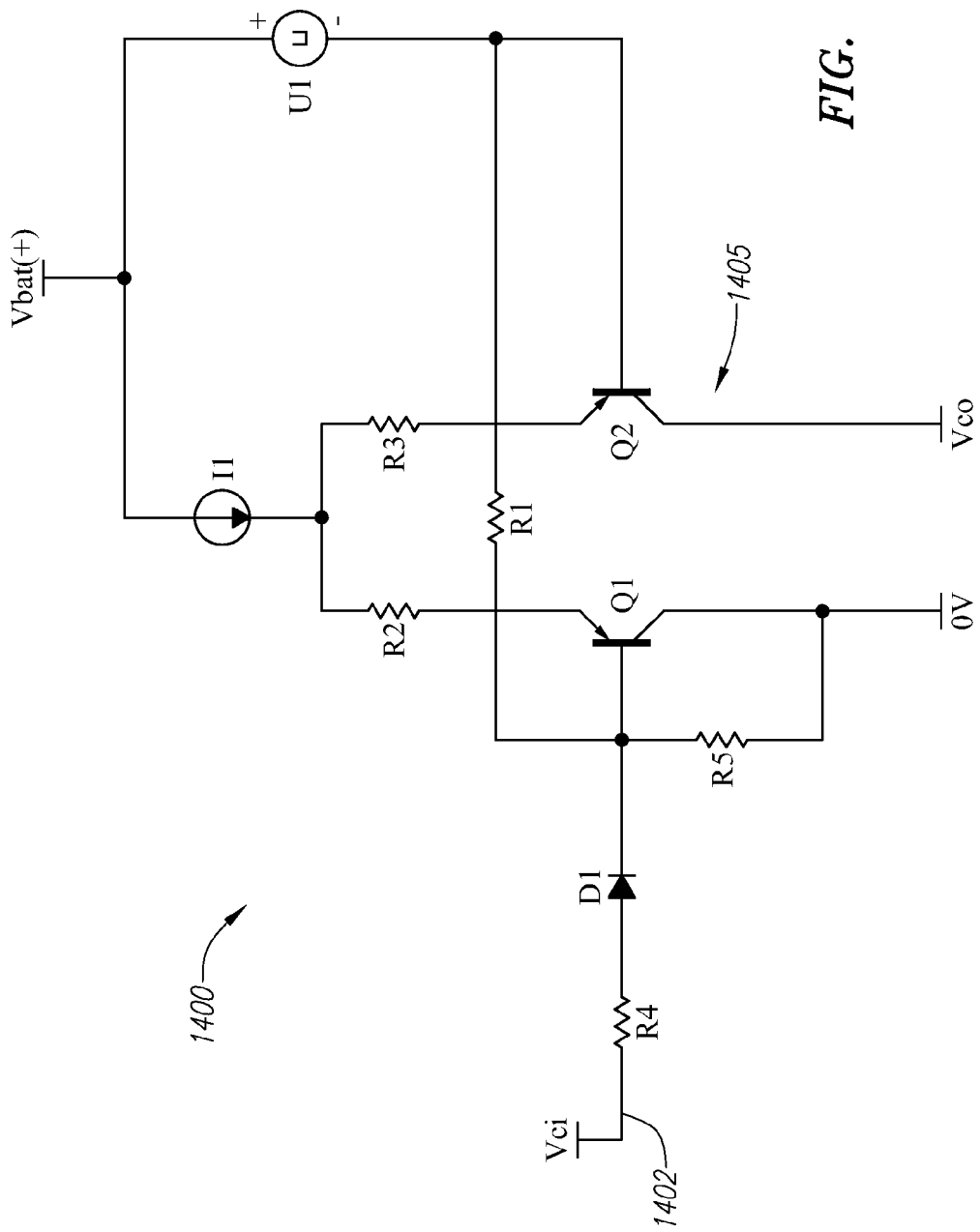
FIG. 14 is a circuit diagram depicting an example of a voltage-controlled current limiting circuit as may be used in connection with the various power boost circuits as disclosed herein.

An example of an embodiment of a voltage-controlled current limiting circuit 1400 is shown in FIG. 14. Adding this circuitry to the amplifier scheme shown in FIGS. 13A, 13B-1 and 13B-2 provides for current limiting for the positive rail reservoir capacitor; a similar (complementary) circuit could be used for the negative booster circuit. Terminal Vci (1402) senses the amplifier output voltage and uses this information to alter the current flowing in the differential amplifier 1405 comprised of transistors Q1 and Q2. When the power amplifier is in boost mode, transistor Q1 is arranged to be cut-off and maximum current then flows through transistor Q2, thus biasing transistor Q5 of FIG. 13B-1 in an ON state. When the power amplifier first comes out of boost mode, it is arranged, by suitable choice of component values, that this condition still applies. Transistor Q5 thus prevents the positive rail booster from re-charging the reservoir capacitors. As the output voltage of the power amplifier drops further, beyond a certain threshold current starts being diverted away from transistor Q2, and so transistor Q5 of FIG. 13B-1 is allowed to turn partially off and provide for a limited charging current into the reservoir capacitors. This threshold can be adjusted by suitable choice of component values, as can the profile of the current limiting action.

While various power boost circuits as described herein may find useful application in audio amplification systems, they are by no means limited to such applications. Rather they may be employed in a variety of different contexts or environments, and may be used, for example, wherever a temporary power boost is needed.

While preferred embodiments of the invention have been described herein, many variations are possible which remain within the concept and scope of the invention. Such variations would become clear to one of ordinary skill in the art after inspection of the specification and the drawings. The invention therefore is not to be restricted except within the spirit and scope of any appended claims.

What is claimed is:

1. A dynamic amplification system for a plurality of amplifiers, comprising:
    a first amplifier coupled to a first input signal for amplification and operative to generate a first output signal;
    a second amplifier coupled to a second input signal for amplification and operative to generate a second output signal;
    a first power boost amplifier electrically connected to a first power supply rail, said first power supply rail providing power at a first nominal voltage level to the first and second amplifiers;
    a second power boost amplifier electrically connected to a second power supply rail, said second power supply rail providing power at a second nominal voltage level to the first and second amplifiers;
    a power boost control circuit;
    a first gain stage operative to generate a modified version of the first input signal and provide the modified version to the power boost control circuit; and
    a second gain stage operative to generate a modified version of the second input signal and provide the modified version to the power boost control circuit;
    wherein said power boost control circuit is operative to provide power boost control signals to said first power boost amplifier and said second power boost amplifier, whereby said first power boost amplifier temporarily boosts the first power supply rail above the first nominal voltage level in tandem with the highest output signal level from said first and second amplifiers as indicated by said modified versions of said first and second input signals, and whereby the second power boost amplifier temporarily lowers the second power supply rail below the second nominal voltage level in tandem with the lowest output signal level from said first and second amplifiers as indicated by said modified versions of said first and second input signals.

2. The dynamic amplification system of claim 1, wherein said modified versions of the first and second input signals are indicative of signal levels of the first and second output signals respectively from the first and second amplifiers.

3. The dynamic amplification system of claim 2, wherein the first gain stage is matched to a gain of the first amplifier, and wherein the second gain stage is matched to a gain of the second amplifier.

4. The dynamic amplification system of claim 2, wherein said power boost controller is operative to cause said first power boost amplifier to raise the first power supply rail above the first nominal voltage level when the highest output signal level, as indicated by said modified versions of said first and second input signals, approaches the first nominal voltage level within a first predefined margin, and wherein said power boost controller is operative to cause said second power boost amplifier to lower the second power supply rail below the second nominal voltage level when the lowest output signal level, as indicated by said modified versions of said first and second input signals, approaches the second nominal voltage level within a second predefined margin.

5. The dynamic amplification system of claim 4, wherein said first nominal voltage level and said second nominal voltage level have the same magnitude but opposite polarity, and wherein said first predefined margin and said second predefined margin have the same magnitude.

6. The dynamic amplification system of claim 4, wherein said power boost controller is operative to cause said first power boost amplifier to maintain the first power supply rail above the highest output signal level from said amplifiers by approximately said first predefined margin when said first power boost amplifier is active, and to cause said second power boost amplifier to maintain the second power supply rail below the lowest output signal level from said amplifiers by approximately said second predefined margin when said second power boost amplifier is active.

7. The dynamic amplification system of claim 1, further comprising:
    a first reservoir capacitor;
    a second reservoir capacitor;
    wherein said first power boost amplifier draws current from said first reservoir capacitor when active to boost the first power supply rail above the first nominal voltage level; and
    wherein the second power boost amplifier draws current from said second reservoir capacitor when active to lower the second power supply rail below the second nominal voltage level.

8. The dynamic amplification system of claim 7, wherein said first reservoir capacitor is coupled to the first power supply rail via a first diode thereby permitting said first reservoir capacitor to charge when not actively boosting power to said amplifiers, and wherein said second reservoir capacitor is coupled to the second power supply rail via a second diode thereby permitting said second reservoir capacitor to charge when not actively boosting power to said amplifiers.

9. The dynamic amplification system of claim 1, further comprising:
    a first voltage sense circuit operative to monitor the first power supply rail feeding the first and second amplifiers; and
    a first variable offset circuit responsive to said first voltage sense circuit operative to inject a first variable feedback signal into said first power boost amplifier, said first variable feedback signal proportional in magnitude to a voltage level of the first power supply rail.

10. The dynamic amplification system of claim 9, further comprising:
    a second voltage sense circuit operative to monitor the second power supply rail feeding the first and second amplifiers; and
    a second variable offset circuit responsive to said second voltage sense circuit operative to inject a second variable feedback signal into said second power boost amplifier, said second variable feedback signal proportional in magnitude to a voltage level of the second power supply rail.

11. A dynamic amplification system, comprising:
    a power boost circuit comprising a power boost amplifier electrically coupled to a power supply rail, said power supply rail providing power at a nominal voltage level to a plurality of amplifiers receiving a plurality of input source signals, each amplifier operative to receive one of said input source signals and to provide an output signal; and
    a plurality of gain stages each coupled to one of said input source signals and outputting a modified version of its corresponding input source signal to the power boost circuit;
    wherein said power boost amplifier temporarily boosts the power supply rail above the nominal voltage level in tandem with the highest output signal level from said amplifiers as indicated by the modified versions of said input source signals.

12. The dynamic amplification system of claim 11, wherein each gain stage is matched to a gain of the amplifier receiving the same input source signal as the gain stage.

13. The dynamic amplification system of claim 11, wherein said power boost amplifier is operative to raise the power supply rail above the nominal voltage level when the highest output signal level, as indicated by the modified versions of said input source signals, approaches the nominal voltage level within a predefined margin.

14. The dynamic amplification system of claim 13, wherein power boost amplifier is operative to maintain the power supply rail above the highest output signal level from said amplifiers by approximately said predefined margin when said power boost amplifier is active.

15. The dynamic amplification system of claim 13, further comprising an energy source providing a charge reservoir, wherein said power boost amplifier draws current from said charge reservoir when active to boost the power supply rail above the nominal voltage level.

16. The dynamic amplification system of claim 11, further comprising:
    a voltage sense circuit operative to monitor the power supply rail; and
    a variable offset circuit responsive to said voltage sense circuit operative to inject a variable feedback signal into said power boost amplifier, said variable feedback signal proportional in magnitude to a voltage level of the power supply rail.

17. A dynamic amplification system, comprising:
    a first power boost amplifier electrically coupled to a first power supply rail, said first power supply rail providing power at a first nominal voltage level to a plurality of amplifiers, each amplifier having an input to receive an input source signal and an output to provide an output signal;

a second power boost amplifier electrically coupled to a second power supply rail, said second power supply rail providing power at a second nominal voltage level to the plurality of amplifiers; and a power boost control circuit, said power boost control circuit configured to monitor indicia of the output signal levels for the amplifiers, and to selectively provide power boost control signals to said first power boost amplifier and said second power boost amplifier;

whereby said first power boost amplifier temporarily boosts the first power supply rail above the first nominal voltage level in tandem with a highest output signal level from among said amplifiers approaching or exceeding a first threshold, and whereby the second power boost amplifier temporarily lowers the second power supply rail below the second nominal voltage level in tandem with a lowest signal level from among said amplifiers approaching or exceeding a second threshold.

18. The dynamic amplification system of claim 17, further comprising a plurality of gain stages, each gain stage coupled to one of the input source signals of said amplifiers, said gain stages configured to output modified versions of said input source signals indicative of the output signal levels of said amplifiers to the power boost control circuit.

19. The dynamic amplification system of claim 18, wherein each gain stage is matched to a gain of the amplifier receiving the same input source signal as the gain stage.

20. The dynamic amplification system of claim 17, further comprising:
a first stored energy source providing a first charge reservoir;
a second stored energy source providing a second charge reservoir;
wherein said first power boost amplifier draws current from said first stored energy source when active to boost the first power supply rail above the first nominal voltage level; and
wherein the second power boost amplifier draws current from said second stored energy source when active to lower the second power supply rail below the second nominal voltage level.

21. The dynamic amplification system of claim 20, wherein said first stored energy source comprises a first reservoir capacitor coupled to the first power supply rail via a first diode thereby permitting said first reservoir capacitor to charge when not actively boosting power to said amplifiers, and wherein said second stored energy source comprises a second reservoir capacitor coupled to the second power supply rail via a second diode thereby permitting said second reservoir capacitor to charge when not actively boosting power to said amplifiers.

22. The dynamic amplification system of claim 17, wherein said first nominal voltage level and said second nominal voltage level have the same magnitude but opposite polarity.

23. An amplification system, comprising:
a first power boost circuit coupled to a first power supply rail, said first power supply rail providing power at a first nominal voltage level to a plurality of amplifiers, each amplifier operative to receive an input source signal and to provide an output signal;
a second power boost circuit coupled to a second power supply rail, said second power supply rail providing power at a second nominal voltage level to the plurality of amplifiers;
a first voltage sense circuit operative to monitor the first power supply rail; and a first variable offset circuit responsive to said first voltage sense circuit operative to inject a first variable feedback signal into said first power boost amplifier, said first variable feedback signal proportional in magnitude to a voltage level of the first power supply rail;

wherein said first power boost amplifier is operative to temporarily boost the first power supply rail above the first nominal voltage level in tandem with the highest output signal level from said amplifiers, and wherein said second power boost amplifier is operative to temporarily lower the second power supply rail below the second nominal voltage level in tandem with the lowest output signal level from said amplifiers.

24. The amplification system of claim 23, further comprising:
a second voltage sense circuit operative to monitor the second power supply rail; and
a second variable offset circuit responsive to said second voltage sense circuit operative to inject a second variable feedback signal into said second power boost amplifier, said second variable feedback signal proportional in magnitude to a voltage level of the second power supply rail.

25. The amplification system of claim 24, wherein said first power boost amplifier is operative to raise the first power supply rail above the first nominal voltage level when the highest output signal level approaches the first nominal voltage level within a first predefined margin, and wherein said second power boost amplifier is operative to lower the second power supply rail below the second nominal voltage level when the lowest output signal level approaches the second nominal voltage level within a second predefined margin.

26. The amplification system of claim 24, wherein said first nominal voltage level and said second nominal voltage level have the same magnitude but opposite polarity.

27. The amplification system of claim 24, wherein first power boost amplifier is operative to maintain the first power supply rail above the highest output signal level from said amplifiers by approximately said first predefined margin when said first power boost amplifier is active, and wherein said second power boost amplifier is operative to maintain the second power supply rail below the lowest output signal level from said amplifiers by approximately said second predefined margin when said second power boost amplifier is active.

28. The amplification system of claim 24, further comprising:
a first reservoir capacitor;
a second reservoir capacitor;
wherein said first power boost amplifier draws current from said first reservoir capacitor when active to boost the first power supply rail above the first nominal voltage level; and
wherein the second power boost amplifier draws current from said second reservoir capacitor when active to lower the second power supply rail below the second nominal voltage level.

29. The amplification system of claim 23, further comprising a plurality of gain stages each coupled to one of said input source signals and outputting a modified version of its corresponding input source signal, each gain stage being matched to a gain of the amplifier receiving the same input source signal as the gain stage.

30. A method for amplification using independent positive and negative power supply rail boosting, comprising:
directly or indirectly monitoring output signal levels of a plurality of amplifiers;

selecting the output signal level having a highest signal level from the output signal levels;

selecting the output signal level having a lowest signal level from the output signal levels;

providing the highest signal level to a first power boost circuit;

providing the lowest signal level to a second power boost circuit; and selectively engaging said first power boost circuit and said second power boost circuit to temporarily boost positive and negative power supply input voltage levels to said amplifiers as the highest signal level and lowest signal level from said amplifiers approaches or exceeds a positive power supply rail or a negative power supply rail, respectively.

31. The method of claim 30, further comprising:

receiving, at said first power boost circuit, a first feedback signal corresponding to the boosted positive power supply input voltage;

applying a first variable gain factor for said first power boost circuit's power boost function that increases as the positive power supply input voltage signal increases in magnitude;

receiving, at said second power boost circuit, a second feedback signal corresponding to the boosted negative power supply input voltage; and applying a second variable gain factor for said second power boost circuit's power boost function that increases as the negative power supply input voltage signal increases in magnitude.

32. The method of claim 31, wherein the output signal levels of said plurality of amplifiers are monitored by coupling a gain stage to an input signal to each of the amplifiers, each gain stage having a gain matching that of the amplifier receiving the corresponding input signal, the output of each gain stage reflecting the output signal level of the corresponding amplifier.

33. The method of claim 31, wherein said first power boost circuit raises the positive power supply rail voltage above a first nominal voltage level when the highest output signal level approaches the first nominal voltage level within a first predefined margin, and wherein said second power boost circuit lowers the negative power supply rail voltage below a second nominal voltage level when the lowest output signal level approaches the second nominal voltage level within a second predefined margin.

34. The method of claim 30, wherein one of more of the amplifiers is coupled to an audio speaker and provides an audio output signal thereto.

* * * * *